(12) United States Patent
Lo et al.

(10) Patent No.: US 12,191,248 B2
(45) Date of Patent: Jan. 7, 2025

(54) SEMICONDUCTOR ARRANGEMENT AND METHOD OF MAKING

(71) Applicant: TAIWAN SEMICONDUCTOR MANUFACTURING COMPANY LIMITED, Hsin-Chu (TW)

(72) Inventors: Wan-Yu Lo, Zhongli (TW); Chung-Hsing Wang, Baoshan Township (TW); Chin-Shen Lin, Taipei (TW); Kuo-Nan Yang, Hsinchu (TW); Hsiang-Ku Shen, Hsinchu (TW); Dian-Hau Chen, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 507 days.

(21) Appl. No.: 17/335,242

(22) Filed: Jun. 1, 2021

(65) Prior Publication Data
US 2022/0285263 A1    Sep. 8, 2022

Related U.S. Application Data

(60) Provisional application No. 63/157,394, filed on Mar. 5, 2021.

(51) Int. Cl.
*H01L 23/522*    (2006.01)
*H01L 21/768*    (2006.01)
*H01L 49/02*    (2006.01)

(52) U.S. Cl.
CPC .... *H01L 23/5223* (2013.01); *H01L 21/76877* (2013.01); *H01L 23/5226* (2013.01); *H01L 28/40* (2013.01)

(58) Field of Classification Search
CPC . H01L 23/5223; H01L 23/5226; H01L 28/40; H01L 21/76805; H01L 23/5222; H01L 27/101
See application file for complete search history.

(56) References Cited

U.S. PATENT DOCUMENTS

2014/0367757 A1* 12/2014 Jakushokas ............ H01L 28/60
                                                          257/306
2017/0018550 A1* 1/2017 Shih ...................... H01L 27/101

* cited by examiner

*Primary Examiner* — Yara B Green
*Assistant Examiner* — Fakeha Sehar
(74) *Attorney, Agent, or Firm* — Cooper Legal Group, LLC

(57) ABSTRACT

A method of forming a semiconductor arrangement includes forming a first capacitor in a first voltage domain and forming a second capacitor in the first voltage domain. The first capacitor is connected in parallel with the second capacitor. A third capacitor and a fourth capacitor are formed in a second voltage domain. The third capacitor is connected in series with the fourth capacitor. The first capacitor and the second capacitor are connected in parallel with a supply terminal of the first voltage domain and a reference terminal of the first voltage domain. The fourth capacitor is connected to a supply terminal of the second voltage domain. The third capacitor is connected to a reference terminal of the second voltage domain.

20 Claims, 14 Drawing Sheets

SEMICONDUCTOR ARRANGEMENT AND METHOD OF MAKING

RELATED APPLICATIONS

This application claims priority to U.S. Provisional Application 63/157,394, titled "SEMICONDUCTOR ARRANGEMENT AND METHOD OF MANUFACTURE" and filed on Mar. 5, 2021, which is incorporated herein by reference.

BACKGROUND

Capacitors are useful to, among other things, store electrical charge within circuits.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
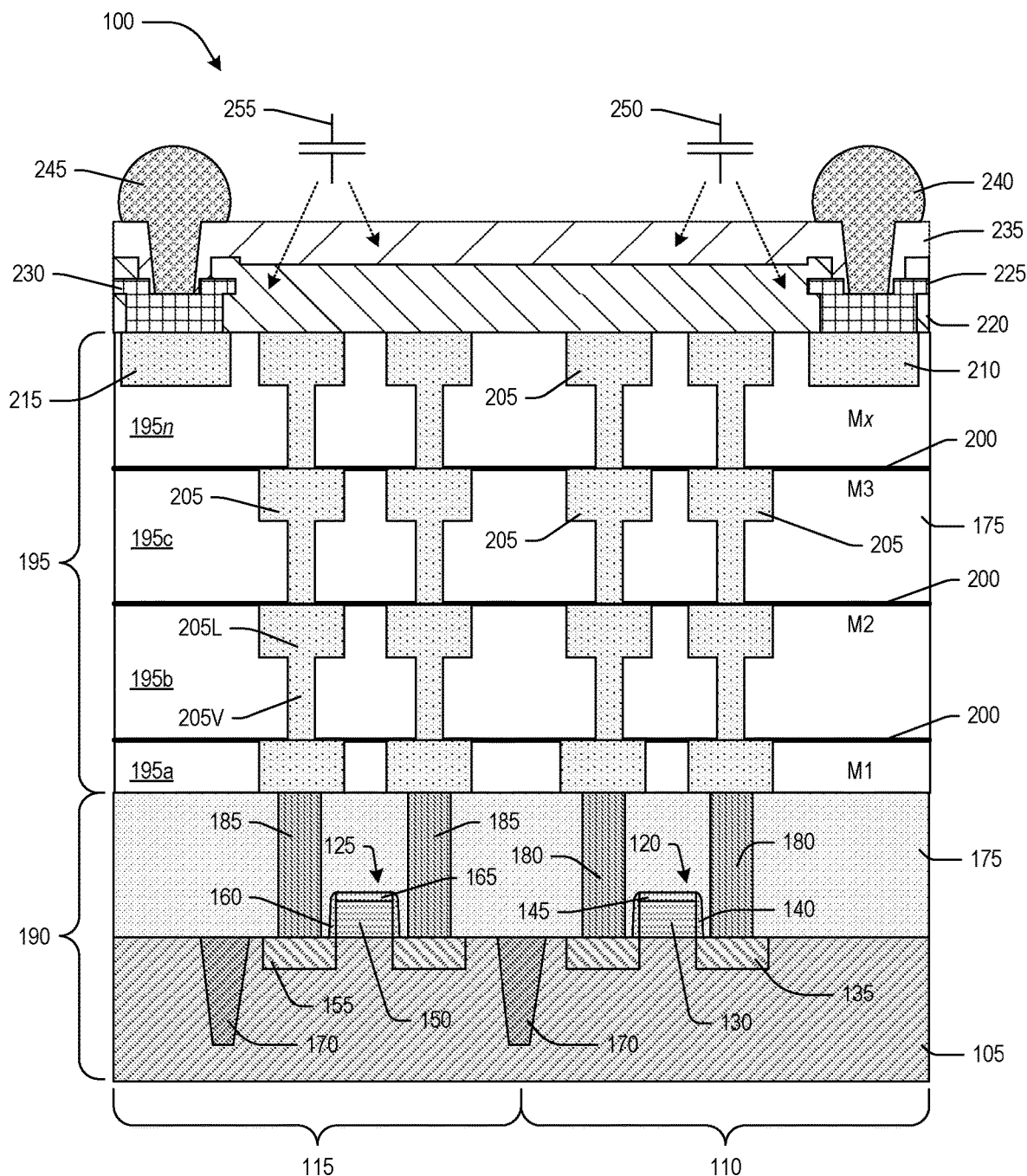
FIG. 1 is a cross-section view of a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein. According to some embodiments, a first stack of alternating layers of conductive material and dielectric material are provided to define a first capacitor network in a first voltage domain and a second stack of alternating layers of the conductive material and the dielectric material are provided to define a second capacitor network in a second voltage domain. A supply voltage of the first voltage domain is less than a breakdown voltage of the dielectric material. A supply voltage of the second voltage domain is greater than the breakdown voltage of the dielectric material. The first capacitor network comprises a first capacitor connected in parallel with a second capacitor, and the second capacitor network comprises a third capacitor connected in series with a fourth capacitor.

For most applications, a low voltage power domain has more cells and occupies a larger portion of a design as compared to a high voltage power domain that has relatively fewer cells and occupies a relatively smaller portion of the design. Capacitor material selection may involve a trade-off between the dielectric constant, k, of the material and a bandgap of the material. Materials may be selected to increase capacitance of a voltage plane stabilizing capacitor in the low voltage domain while inhibiting breakdown in a voltage plane stabilizing capacitor for the high voltage domain. Providing a first capacitor network with parallel capacitors in the low voltage domain allows a dielectric material to be selected to increase capacitance and stabilize the voltage plane of the low power domain. Providing a second capacitor network with series capacitors in the high voltage domain reduces a voltage on the capacitors in the capacitor network so that breakdown of the dielectric material is inhibited. The same and/or similar process flow may be used for the different voltage domains. Metal-insulator-metal (MIM) capacitors may be used in a power domain where the voltage is larger than the breakdown voltage of the dielectric for the capacitors.

FIG. 1 is a cross-section view illustrating a portion of a semiconductor arrangement 100 according to some embodiments. In an embodiment, the semiconductor arrangement 100 is formed on a substrate layer 105 comprising at least one of an epitaxial layer, a single crystalline semiconductor material, such as, but not limited to, at least one of Si, Ge, SiGe, InGaAs, GaAs, InSb, GaP, GaSb, InAlAs, GaSbP, GaAsSb, or InP, a silicon-on-insulator (SOI) structure, a wafer, or a die formed from a wafer. In some embodiments, the substrate layer 105 comprises at least one of crystalline silicon or other suitable materials. Other structures and/or configurations of the substrate layer 105 are within the scope of the present disclosure.

According to some embodiments, the semiconductor arrangement 100 comprises a first region 110 and a second region 115. In some embodiments, the first region 110 is a core region and/or a logic region with a semiconductor device 120 in a first voltage domain operating according to a first supply voltage. In some embodiments, the second region 115 is an input/output region with a semiconductor device 125 in a second voltage domain operating according to a second supply voltage. For example, the first supply voltage in the core region may be less than the second supply voltage in the input/output region.

In an embodiment, the first region 110 is formed on or within the substrate layer 105. In some embodiments, the first region 110 comprises the semiconductor device 120 formed on or within the substrate layer 105. In some embodiments, the semiconductor device 120 comprises a gate structure 130, source/drain regions 135, a sidewall spacer 140, a gate cap layer 145, etc. According to some embodiments, the gate structure 130 is formed by forming a sacrificial gate structure comprising a sacrificial gate dielectric layer, a sacrificial polysilicon layer, and a hard mask layer. In some embodiments, a patterning process is performed to pattern the hard mask layer corresponding to the pattern of gate structures to be formed, and an etch process is performed using the patterned hard mask layer to etch the sacrificial polysilicon layer and the sacrificial gate dielectric layer to define the sacrificial gate structure. In some embodiments, remaining portions of the hard mask layer form a cap layer over the portions of the sacrificial polysilicon layer remaining after the etch process. In some embodiments, the sacrificial gate structure is later replaced with a replacement gate dielectric layer and a replacement gate electrode (not separately shown).

In some embodiments, the replacement gate dielectric layer comprises a high-k dielectric material. As used herein, the term "high-k dielectric" refers to the material having a dielectric constant, k, greater than or equal to about 3.9, which is the k value of $SiO_2$. The material of the high-k dielectric layer may comprise any suitable materials. Examples of the material of the high-k dielectric layer include, but are not limited to, $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, an alloy thereof and/or other suitable materials. Each value of x is independently from 0.5 to 3, and each value of y is independently from 0 to 2. In some embodiments, the gate dielectric layer comprises a native oxide layer formed by exposure of the semiconductor arrangement 100 to oxygen at various points in the process flow, causing the formation of silicon dioxide on exposed surfaces. In some embodiments, an additional layer of dielectric material, such as comprising silicon dioxide, a high-k dielectric material, and/or other suitable materials, is formed over the native oxide to form the gate dielectric layer.

In some embodiments, the replacement gate electrode comprises a barrier layer, one or more work function material layers, a seed layer, a metal fill layer, and/or other suitable layers. In some embodiments, the metal fill layer comprises tungsten, aluminum, copper, cobalt, and/or other suitable materials. In some embodiments, the gate dielectric layer and/or the one or more layers that comprise the gate electrode are formed by at least one of atomic layer deposition (ALD), physical vapor deposition (PVD), chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), or other suitable techniques. In some embodiments, the replacement gate electrode is recessed and the gate cap layer 145 is formed in the recess.

In some embodiments, the sidewall spacer 140 is formed adjacent the gate structure 130. In some embodiments, the sidewall spacer 140 is formed by depositing a spacer layer over the gate structure 130 and performing an anisotropic etch process to remove horizontal portions of the spacer layer. In some embodiments, the sidewall spacer 140 comprises silicon nitride and/or other suitable materials.

In some embodiments, the source/drain regions 135 are formed in the substrate layer 105 after forming the gate structure 130. For example, in some embodiments, portions of the substrate layer 105 are doped through an implantation process to form the source/drain regions 135. In some embodiments, an etch process is performed to recess the substrate layer 105 adjacent the sidewall spacer 140 and an epitaxial growth process is performed to form the source/drain regions 135. Other structures and/or configurations of the device 120 are within the scope of the present disclosure.

In an embodiment, the second region 115 is formed on or within the substrate layer 105. In some embodiments, the second region 115 comprises the semiconductor device 125 formed on or within the substrate layer 105. In some embodiments, the semiconductor device 125 comprises a gate structure 150, source/drain regions 155, a sidewall spacer 160, a gate cap layer 165, etc. In some embodiments, one or more processes described for forming the device 120 may be used to form the device 125. In some embodiments, one or more materials described for forming the device 120 may be used to form the device 125. In some embodiments, at least some different materials are used due to the different voltage domain. For example, the gate dielectric material may be different and/or may have a different thickness in the device 125 compared to the device 120. In some embodiments, the materials of the gate electrode may also differ in the device 125 compared to the device 120. Other structures and/or configurations of the device 125 are within the scope of the present disclosure.

In an embodiment, one or more shallow trench isolation (STI) structures 170 are formed within the substrate layer 105. In some embodiments, the STI structures 170 are formed by forming at least one mask layer over the substrate layer 105. In some embodiments, the mask layer comprises a layer of oxide material over the substrate layer 105, a layer of nitride material over the layer of oxide material, and/or one or more other suitable layers. At least some of the layer of mask layer is removed to define an etch mask for use as a template to etch the substrate layer 105 to form trenches. A dielectric material is formed in the trenches to define the STI structures 170. In some embodiments, the STI structures 170 include multiple layers, such as an oxide liner, a nitride liner formed over the oxide liner, an oxide fill material formed over the nitride liner, and/or other suitable materials.

In some embodiments, a fill material of the STI structures 170 is formed using a high density (HDP) plasma process. The HDP process uses precursor gases comprising at least one of silane ($SiH_4$), oxygen, argon, or other suitable gases. The HDP process includes a deposition component, which forms material on surfaces defining the trenches, and a sputtering component, which removes or relocates deposited material. A deposition-to-sputtering ratio depends on gas ratios employed during the deposition. According to some embodiments, argon and oxygen act as sputtering sources, and the particular values of the gas ratios are determined based on aspect ratios of the trenches. After forming the fill material, an anneal process is performed to densify the fill material. In some embodiments, the STI structures 170 generate compressive stress that serves to compress the first region 110 and/or the second region 115.

Although the substrate layer 105 and the STI structures 170 are illustrated as having coplanar upper surfaces at an interface where the substrate layer 105 abuts the STI structures 170, the relative heights can vary. For example, the STI structures 170 can be recessed relative to the substrate layer 105 or the substrate layer 105 can be recessed relative to the STI structures 170. The relative heights at the interface depend on the processes performed for forming the STI structures 170, such as at least one of deposition, planarization, mask removal, surface treatment, or other suitable techniques. In some embodiments, the STI structures 170 are formed prior to forming the devices 120, 125. Other structures and/or configurations of the STI structures 170 are within the scope of the present disclosure.

In some embodiments, a dielectric layer 175 is formed over the devices 120, 125. In some embodiments, the dielectric layer 175 is formed prior to forming the replacement gate structures, if applicable. In some embodiments, the dielectric layer 175 comprises silicon dioxide, a low-k material, and/or other suitable materials. A low-k layer is, in some embodiments, further characterized or classified as ultra low-K (ULK), extra low-K (ELK), or extreme low-k (XLK), where the classification is generally based upon the k value. For example, ULK generally refers to materials with a k value of between about 2.7 to about 2.4, ELK generally refers to materials with a k value of between about 2.3 to about 2.0, and XLK generally refers to materials with a k value of less than about 2.0. In some embodiments, the dielectric layer 175 comprises one or more layers of a dielectric material. Low-k dielectric materials have a k-value (dielectric constant) lower than about 3.9. Some low-k dielectric materials have a k-value lower than about 3.5 and may have a k-value lower than about 2.5. In some embodiments, the materials for the dielectric layer 175 comprise at least one of Si, O, C, or H, such as SiCOH, SiOC, oxygen-doped SiC (ODC), nitrogen-doped SiC (NDC), plasma-enhanced oxide (PEOX), and/or other suitable materials. Organic material such as polymers may be used for the dielectric layer 175. In some embodiments, the dielectric layer 175 comprises one or more layers of a carbon-containing material, organo-silicate glass, a porogen-containing material, and/or other suitable materials. The dielectric layer 175 comprises nitrogen in some embodiments. In some embodiments, the dielectric layer 175 is formed by using, for example, at least one of CVD, PECVD, LPCVD, ALCVD, a spin-on technology, or other suitable techniques. In some embodiments, the dielectric layer 175 comprises one or more layers, at least some of which may have a same material composition. In some embodiments, there are one or more layers of the dielectric layer 175, at least some of which may have a same material composition. Other structures and/or configurations of the dielectric layer 175 are within the scope of the present disclosure.

In some embodiments, the first region 110 comprises one or more conductive contacts 180 formed in the dielectric layer 175 and electrically connected to the device 120 within the first region 110. In some embodiments, the second region 115 comprises one or more conductive contacts 185 formed in the dielectric layer 175 and electrically connected to the device 125 within the second region 115. The conductive contacts 180, 185 are formed in any number of ways, such as by a single damascene process, a dual damascene process, a trench silicide process, and/or other suitable techniques. In some embodiments, additional contacts (not shown) are formed to contact the device 120 and/or the device 125 in different positions, such as into or out of the page. In some embodiments, the conductive contacts 180, 185 comprise a barrier layer, a seed layer, a metal fill layer, and/or other suitable layers. In some embodiments, the metal fill layer comprises tungsten, aluminum, copper, cobalt, and/or other suitable materials. Other structures and/or configurations of the conductive contacts 180, 185 are within the scope of the present disclosure. In some embodiments, at least one of the devices 120, 125, the conductive contacts 180, 185, the dielectric layer 175, the substrate layer 105, or the STI structures 170 define a device layer 190 of the semiconductor arrangement 100.

In some embodiments, the semiconductor arrangement 100 comprises one or more dielectric layers 195 formed over the device layer 190. According to some embodiments, the one or more dielectric layers 195 comprise a second dielectric layer 195a, a third dielectric layer 195b, a fourth dielectric layer 195c, and an n-th dielectric layer 195n. Any number of dielectric layers are contemplated. In some embodiments, at least one of the dielectric layers 195 comprises a material with a medium or low dielectric constant, such as $SiO_2$. In some embodiments, at least one of the dielectric layers 195 comprises a dielectric material with a relatively high dielectric constant, as described for the dielectric layer 175. The dielectric layers 195 are formed in any number of ways, such as by thermal growth, chemical growth, ALD, CVD, PECVD, and/or other suitable techniques. In some embodiments, one or more of the dielectric layers 195 in a lower portion comprise ULK or ELK dielectric materials, one or more of the dielectric layers 195 in an intermediate portion comprise low-k dielectric materials, and one or more of the dielectric layers 195 in an upper portion comprise standard k dielectric materials, such as doped or undoped silicon glass.

In some embodiments, the semiconductor arrangement 100 comprises one or more etch stop layers 200 separating the dielectric layers 195. In some embodiments, the etch stop layers 200 stop an etching process between the dielectric layers 195. According to some embodiments, the etch stop layers 200 comprise a dielectric material having a different etch selectivity from the dielectric layers 195. In some embodiments, at least one of the etch stop layers 200 comprises SiN, SiCN, SiCO, and/or CN. The etch stop layers 200 are formed in any number of ways, such as by thermal growth, chemical growth, ALD, CVD, PECVD, and/or other suitable techniques.

In some embodiments, the semiconductor arrangement 100 comprises one or more conductive contacts 205 electrically connected to the conductive contacts 180, 185. In an embodiment, the conductive contacts 205 extend through respective dielectric layers 195. In some embodiments, at least some of the conductive contacts 205 comprise a via portion 205V and a line portion 205L. The line portions 205L are wider than the via portions and have an axial length extending into the page. In some embodiments, the conductive contacts 205 comprise a barrier layer, a seed layer, a metal fill layer, and/or other suitable layers. In some embodiments, the metal fill layer comprises tungsten, aluminum, copper, cobalt, and/or other suitable materials. Other structures and/or configurations of the conductive contacts 205 are within the scope of the present disclosure. In some embodiments, a combination of a particular dielectric layer 195 and one or more conductive contacts 205 in the particular dielectric layer 195 define a metallization layer of the semiconductor arrangement 100, such as layers "M1", "M2", "M3", and "Mx".

In some embodiments, conductive power supply lines 210, 215 are formed in the upper dielectric layer 195n. In some embodiments, the conductive power supply line 210 is a positive supply or reference terminal associated with the first voltage domain in the first region 110 and the conductive power supply line 215 is a positive supply or reference terminal associated with the second voltage domain in the second region 115. In some embodiments, the conductive power supply lines 210, 215 comprise a barrier layer, a seed layer, a metal fill layer, and/or other suitable layers. In some embodiments, the metal fill layer comprises tungsten, aluminum, copper, cobalt, and/or other suitable materials. In some embodiments, additional conductive power supply lines 210, 215 are provided. For example, each voltage domain comprises a conductive power supply line for a positive supply voltage, such as $V_{DD}$, and a conductive power supply line for a reference voltage, such as $V_{SS}$. Other structures and/or configurations of the conductive power supply lines 210, 215 are within the scope of the present disclosure.

In some embodiments, at least one passivation layer 220 is formed over the dielectric layer 195n. In some embodiments, the passivation layer 220 comprises silicon oxide/silicon nitride ($SiO_2/Si_3N_4$), titanium nitride, doped silicon dioxide, polyimide, and/or other suitable materials. In some embodiments, the passivation layer 220 is formed by ALD, CVD, PECVD, and/or other suitable techniques. Other structures and/or configurations of the passivation layer 220 are within the scope of the present disclosure.

In some embodiments, conductive contact pads 225, 230 are formed in the passivation layer 220. In some embodiments, the conductive contact pads 225, 230 are electrically connected to the conductive power supply lines 210, 215 and comprise aluminum and/or other suitable materials. Other structures and/or configurations of the conductive contact pads 225, 230 are within the scope of the present disclosure.

In some embodiments, a polyimide layer 235 is formed over the passivation layer 220 and patterned to expose the conductive contact pads 225, 230. In some embodiments, the polyimide layer 235 is a photosensitive polyimide layer that is patterned with photolithography and can, after patterning and etching, remain on the surface on which it has been deposited to serve as a passivation layer. In some embodiments, a precursor of the polyimide layer 235 is first deposited by spin coating and/or other suitable techniques. The precursor is, after a low temperature pre-bake, exposed to electromagnetic radiation using a light source and a reticle. Portions of the precursor that are exposed are cross linked thereby leaving unexposed portions (that are not cross linked) over the conductive contact pads 225, 230. During subsequent development, the unexposed portions over the conductive contact pads 225, 230 are dissolved, thereby providing openings over the conductive contact pads 225, 230. In some embodiments, a thermal curing process is performed on the polyimide layer 235. The polyimide layer 235 also serves as a passivation layer. Other structures and/or configurations of the polyimide layer 235 are within the scope of the present disclosure.

In some embodiments, solder bumps 240, 245 are formed over the polyimide layer 235 and are electrically connected to the conductive contact pads 225, 230. In some embodiments, an under-bump metal layer (not shown), such as comprising nickel and/or other suitable materials, is formed over the conductive contact pads 225, 230 prior to forming the solder bumps 240, 245. In some embodiments, the solder bumps 240, 245 are formed by applying a flux and/or paste to a solder material and performing a thermal reflowing process. Other structures and/or configurations of the solder bumps 240, 245 are within the scope of the present disclosure.

According to some embodiments, the semiconductor arrangement 100 comprises a first capacitor network 250 for the first voltage domain of the first region 110 to stabilize an associated first power supply, such as connected through the power supply line 210, and a second capacitor network 255 for the second voltage domain of the second region 115 to stabilize an associated second power supply, such as connected through the power supply line 215. For example, the first capacitor network 250 serves to reduce a magnitude of a voltage drop on the associated first power supply, such as might occur from a large supply current and/or the second capacitor network 255 serves to reduce a magnitude of a voltage drop on the associated second power supply, such as might occur from a large supply current. In some embodiments, the capacitor networks 250, 255 are formed in the dielectric layer 195n and connected to the associated conductive power supply lines 210, 215. In some embodiments, the capacitor networks 250, 255 are formed in the passivation layer 220 and connected to the associated conductive contact pads 225, 230. In some embodiments, the dielectric layer 195n and/or the passivation layer 220 are part of a redistribution layer (RDL) or voltage plane of the semiconductor arrangement 100. Other structures and/or configurations of the capacitor networks 250, 255 are within the scope of the present disclosure.

FIGS. 2-8 are cross-section views of the semiconductor arrangement 100 at various stages of fabrication, in accordance with some embodiments. FIGS. 2-8 illustrate fabrication of the capacitor networks 250, 255. In some embodiments, where the capacitor networks 250, 255 are formed in the dielectric layer 195n, at least some of the acts of FIGS. 2-8 may be performed prior to forming the dielectric layer 195n. In some embodiments, where the capacitor networks 250, 255 are formed in the passivation layer 220, at least some of the acts of FIGS. 2-8 may be performed prior to forming the passivation layer 220.

Figure 2:
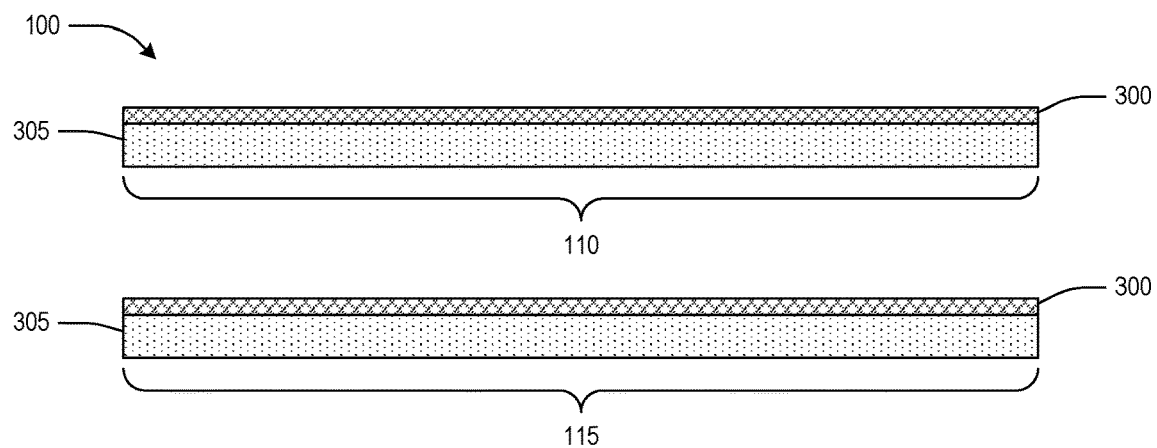
FIGS. 2-15 are cross-section views of a semiconductor arrangement at various stages of fabrication, in accordance with some embodiments.

Referring to FIG. 2, a first conductive layer 300 is formed over a first dielectric layer 305, according to some embodiments. In some embodiments, the first dielectric layer 305 is an etch stop layer 200 over the dielectric layer 195n, an etch stop layer over a dielectric layer under the dielectric layer 195n, a dielectric layer under the dielectric layer 195n, and/or the dielectric layer 195n. In some embodiments, the first dielectric layer 305 comprises a dielectric material with a relatively high dielectric constant, such as hafnium dioxide, zirconium dioxide, lanthanum oxide, yttrium oxide, strontium oxide, tantalum oxide, barium oxide, and/or other suitable materials. The first dielectric layer 305 may be formed by thermal growth, chemical growth, ALD, CVD PECVD, and/or other suitable techniques. In some embodiments, the first conductive layer 300 comprises a conductive material, such as Ti, TiN, Ta, TaN, TaC, W, Ir, Ru, Pt, aluminum, copper, and/or other suitable materials. In some embodiments, the first conductive layer 300 is formed by ALD, PVD, CVD, thermal evaporation, and/or other suitable techniques.

Figure 3:
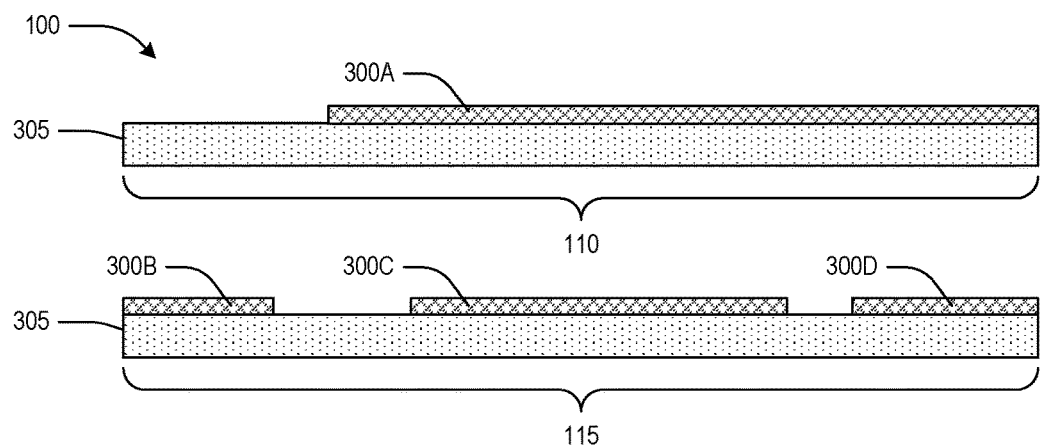

Referring to FIG. 3, the first conductive layer 300 is patterned to form conductive plates 300A, 300B, 300C, 300D, according to some embodiments. In some embodiments, the first conductive layer 300 is patterned by forming a mask over the first conductive layer 300, performing a photolithography patterning process for removing portions of the mask, and performing an etch process for removing portions of the first conductive layer 300 not covered by remaining portions of the mask to define the conductive plates 300A, 300B, 300C, 300D.

Figure 4:
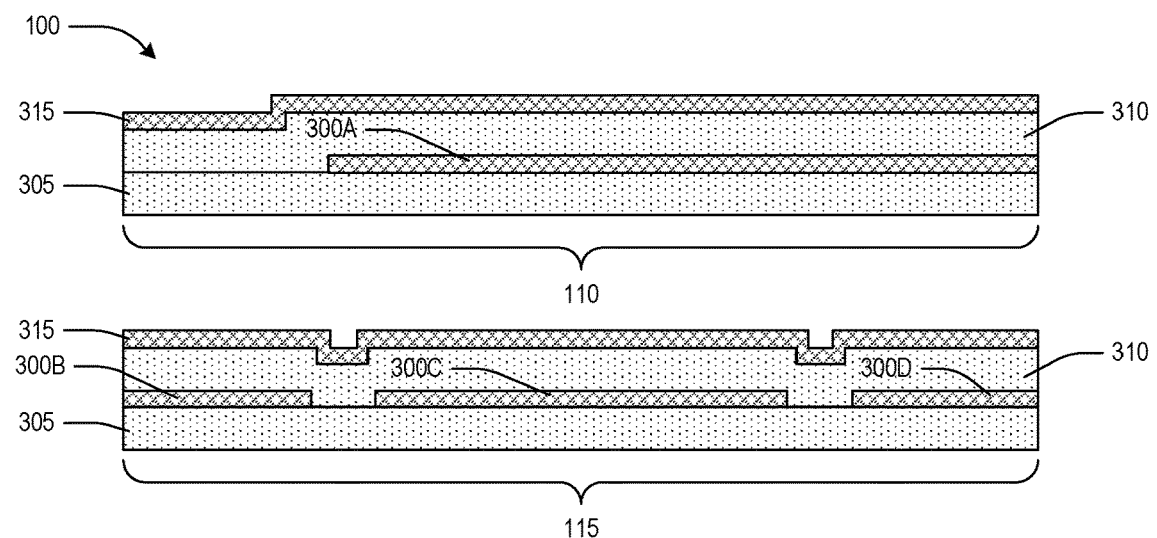

Referring to FIG. 4, a second dielectric layer 310 is formed over the first dielectric layer 305 and the conductive plates 300A, 300B, 300C, 300D and a second conductive layer 315 is formed over the second dielectric layer 310, according to some embodiments. In some embodiments, the second dielectric layer 310 comprises a dielectric material with a relatively high dielectric constant, such as hafnium dioxide, zirconium dioxide, lanthanum oxide, yttrium oxide, strontium oxide, tantalum oxide, barium oxide, and/or other suitable materials. The second dielectric layer 310 may be formed by thermal growth, chemical growth, ALD, CVD PECVD, and/or other suitable techniques. In some embodiments, a material composition of the second dielectric layer 310 is the same as a material composition of the first dielectric layer 305. In some embodiments, a material composition of the second dielectric layer 310 is not the same as a material composition of the first dielectric layer 305. In some embodiments, the second conductive layer 315 comprises a conductive material, such as Ti, TiN, Ta, TaN, TaC, W, Ir, Ru, Pt, aluminum, copper, and/or other suitable materials. In some embodiments, the second conductive layer 315 is formed by ALD, PVD, CVD, thermal evaporation, and/or other suitable techniques. In some embodiments, a material composition of the second conductive layer 315 is the same as a material composition of the first conductive layer 300. In some embodiments, a material composition of the second conductive layer 315 is not the same as a material composition of the first conductive layer 300.

Figure 5:
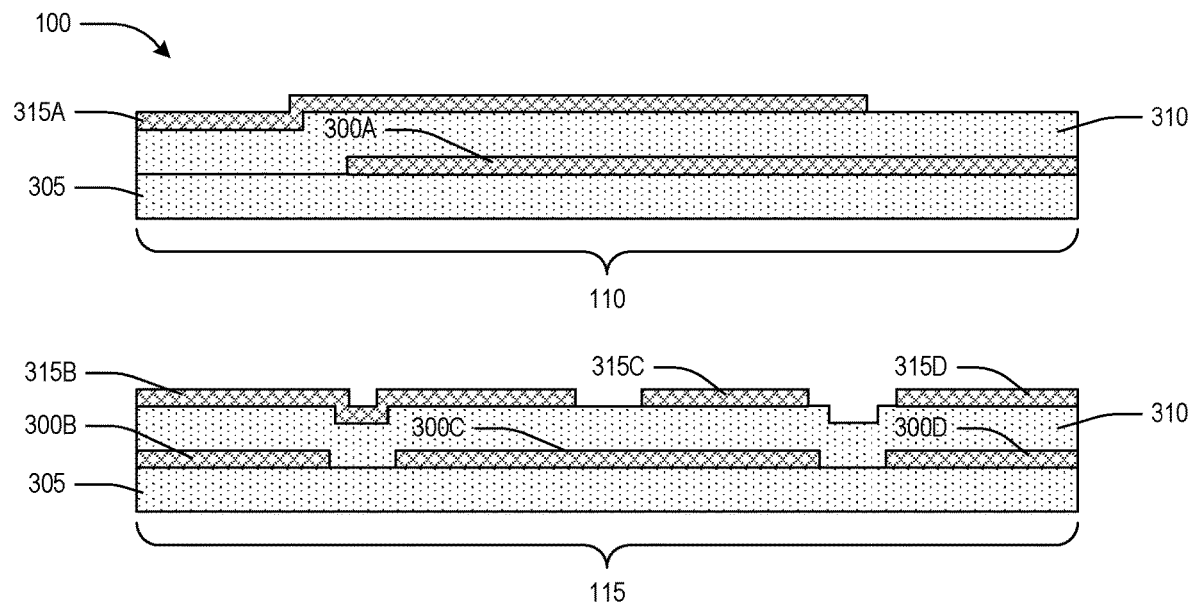

Referring to FIG. 5, the second conductive layer 315 is patterned to form conductive plates 315A, 315B, 315C, 315D, according to some embodiments. In some embodiments, the second conductive layer 315 is patterned by forming a mask over the second conductive layer 315, performing a photolithography patterning process for removing portions of the mask, and performing an etch process for removing portions of the second conductive layer 315 not covered by remaining portions of the mask to define the conductive plates 315A, 315B, 315C, 315D.

Figure 6:
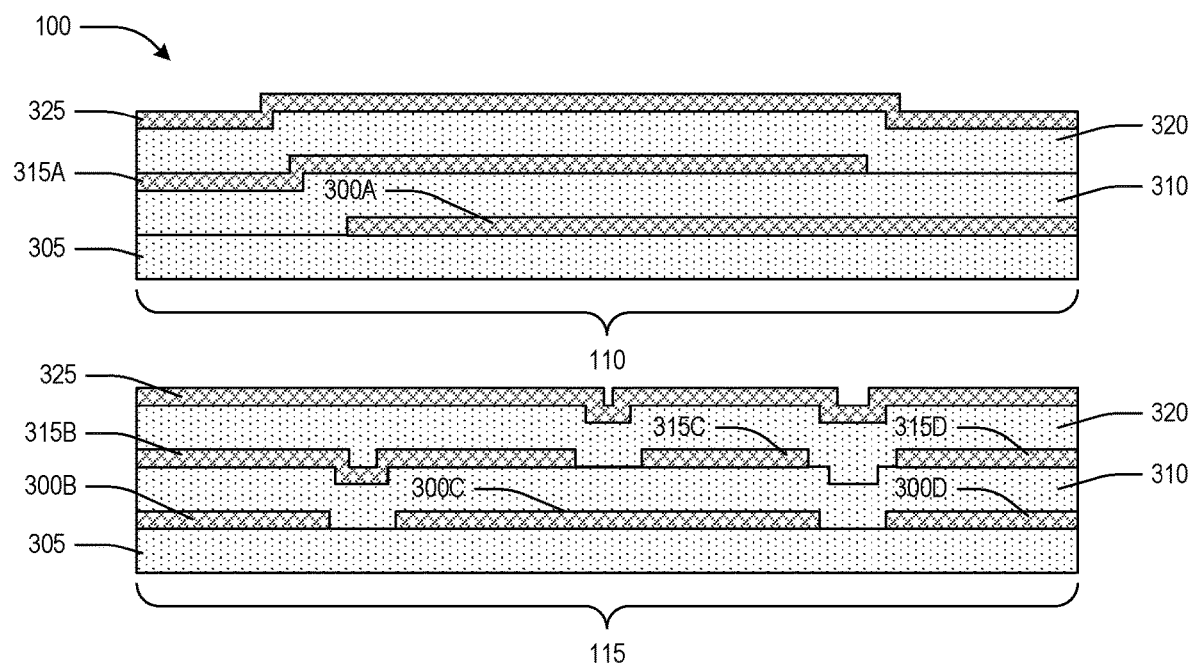

Referring to FIG. 6, a third dielectric layer 320 is formed over the second dielectric layer 310 and the conductive plates 315A, 315B, 315C, 315D and a third conductive layer 325 is formed over the third dielectric layer 320, according to some embodiments. In some embodiments, the third dielectric layer 320 comprises a dielectric material with a relatively high dielectric constant, such as hafnium dioxide, zirconium dioxide, lanthanum oxide, yttrium oxide, strontium oxide, tantalum oxide, barium oxide, and/or other suitable materials. The third dielectric layer 320 may be formed by thermal growth, chemical growth, ALD, CVD PECVD, and/or other suitable techniques. In some embodiments, a material composition of the third dielectric layer 320 is the same as a material composition of the first dielectric layer 305 and/or the second dielectric layer 310. In some embodiments, a material composition of the third dielectric layer 320 is not the same as a material composition of the first dielectric layer 305 and/or the second dielectric layer 310. In some embodiments, the third conductive layer 325 comprises a conductive material, such as Ti, TiN, Ta, TaN, TaC, W, Ir, Ru, Pt, aluminum, copper, and/or other suitable materials. In some embodiments, the third conductive layer 325 is formed by ALD, PVD, CVD, thermal evaporation, and/or other suitable techniques. In some embodiments, a material composition of the third conductive layer 325 is the same as a material composition of the first conductive layer 300 and/or the second conductive layer 315. In some embodiments, a material composition of the third conductive layer 325 is not the same as a material composition of the first conductive layer 300 and/or the second conductive layer 315.

Figure 7:
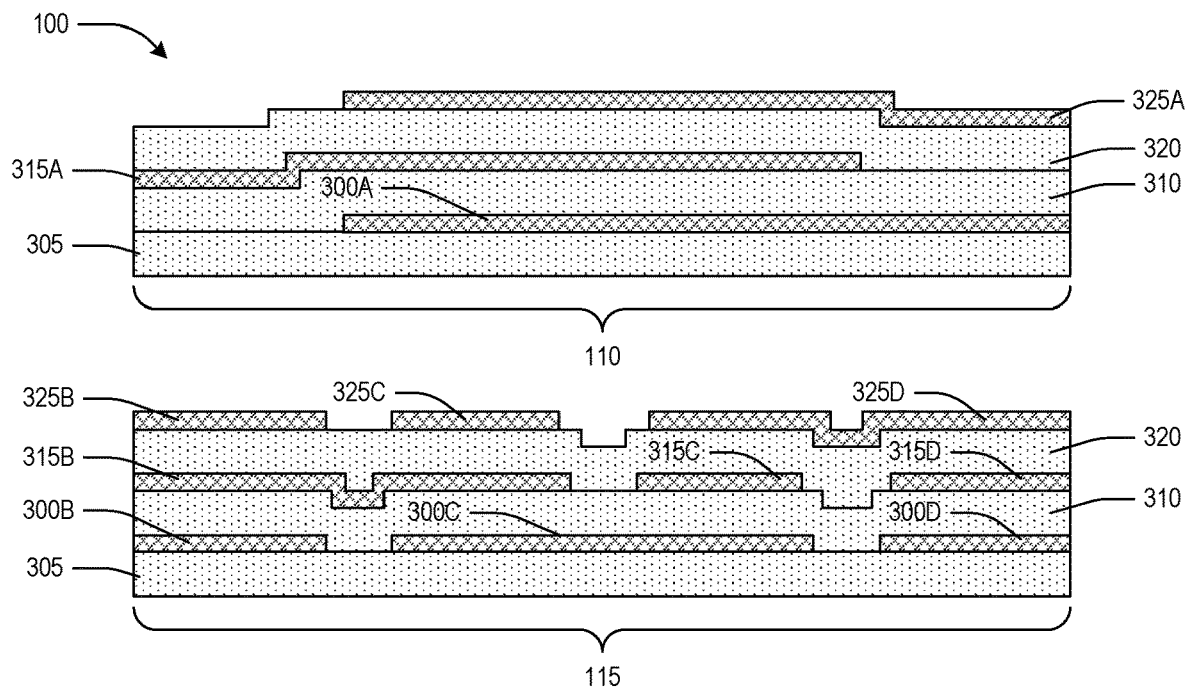

Referring to FIG. 7, the third conductive layer 325 is patterned to form conductive plates 325A, 325B, 325C, 325D, according to some embodiments. In some embodiments, the third conductive layer 325 is patterned by forming a mask over the third conductive layer 325, performing a photolithography patterning process for removing portions of the mask, and performing an etch process for removing portions of the third conductive layer 325 not covered by remaining portions of the mask to define the conductive plates 325A, 325B, 325C, 325D.

Figure 8:
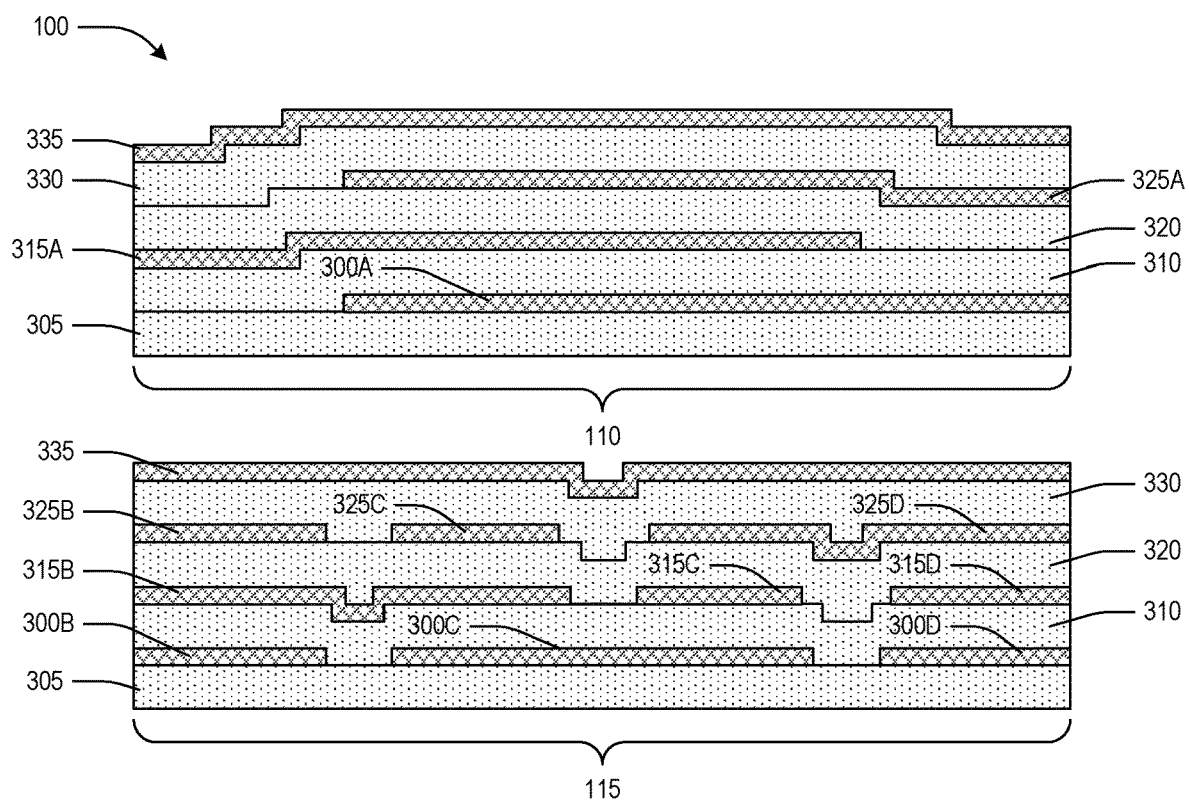

Referring to FIG. 8, a fourth dielectric layer 330 is formed over the third dielectric layer 320 and the conductive plates 325A, 325B, 325C, 325D and a fourth conductive layer 335 is formed over the fourth dielectric layer 330, according to some embodiments. In some embodiments, the fourth dielectric layer 330 comprises a dielectric material with a relatively high dielectric constant, such as hafnium dioxide, zirconium dioxide, lanthanum oxide, yttrium oxide, strontium oxide, tantalum oxide, barium oxide, and/or other suitable materials. The fourth dielectric layer 330 may be formed by thermal growth, chemical growth, ALD, CVD PECVD, and/or other suitable techniques. In some embodiments, a material composition of the fourth dielectric layer 330 is the same as a material composition of the first dielectric layer 305, the second dielectric layer 310, and/or the third dielectric layer 320. In some embodiments, a material composition of the fourth dielectric layer 330 is not the same as a material composition of the first dielectric layer 305, the second dielectric layer 310, and/or the third dielectric layer 320. In some embodiments, the fourth conductive layer 335 comprises a conductive material, such as Ti, TiN, Ta, TaN, TaC, W, Ir, Ru, Pt, aluminum, copper, and/or other suitable materials. In some embodiments, the fourth conductive layer 335 is formed by ALD, PVD, CVD, thermal evaporation, and/or other suitable techniques. In some embodiments, a material composition of the fourth conductive layer 335 is the same as a material composition of the first conductive layer 300, the second conductive layer 315, and/or the third conductive layer 325. In some embodiments, a material composition of the fourth conductive layer 335 is not the same as a material composition of the first conductive layer 300, the second conductive layer 315, and/or the third conductive layer 325.

Figure 9:
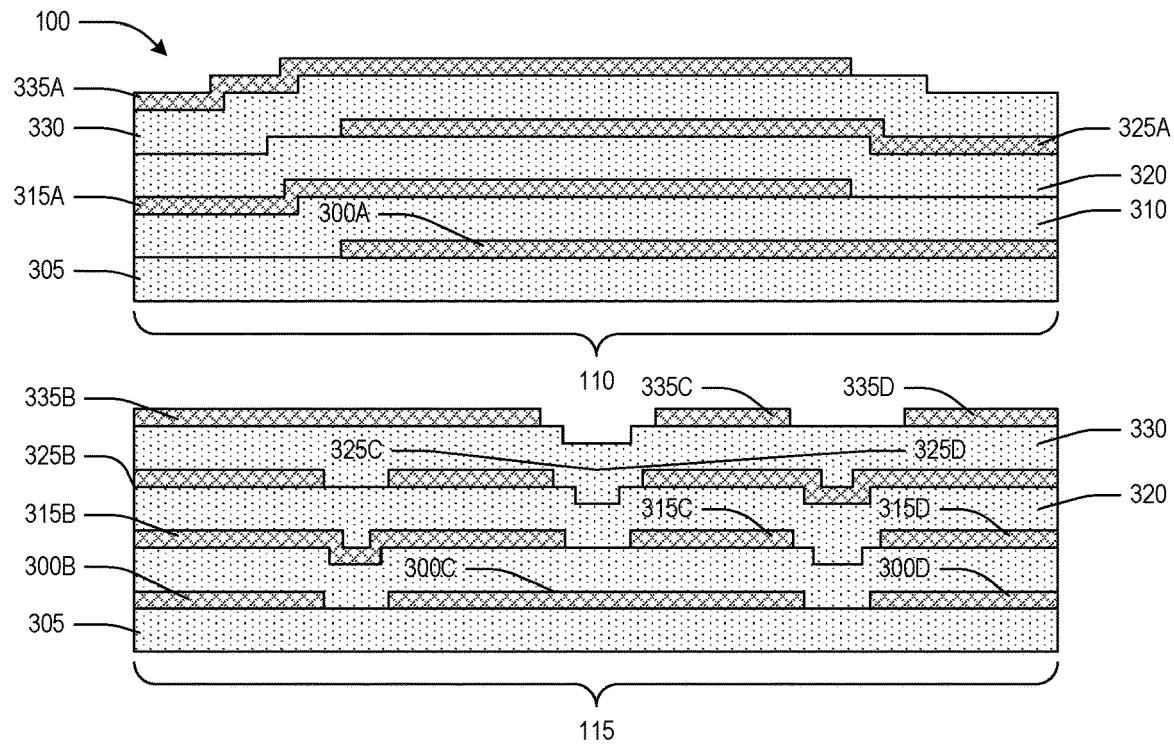

Referring to FIG. 9, the fourth conductive layer 335 is patterned to form conductive plates 335A, 335B, 335C, 335D, according to some embodiments. In some embodiments, the fourth conductive layer 335 is patterned by forming a mask over the fourth conductive layer 335, performing a photolithography patterning process for removing portions of the mask, and performing an etch process for removing portions of the fourth conductive layer 335 not covered by remaining portions of the mask to define the conductive plates 335A, 335B, 335C, 335D.

Figure 10:
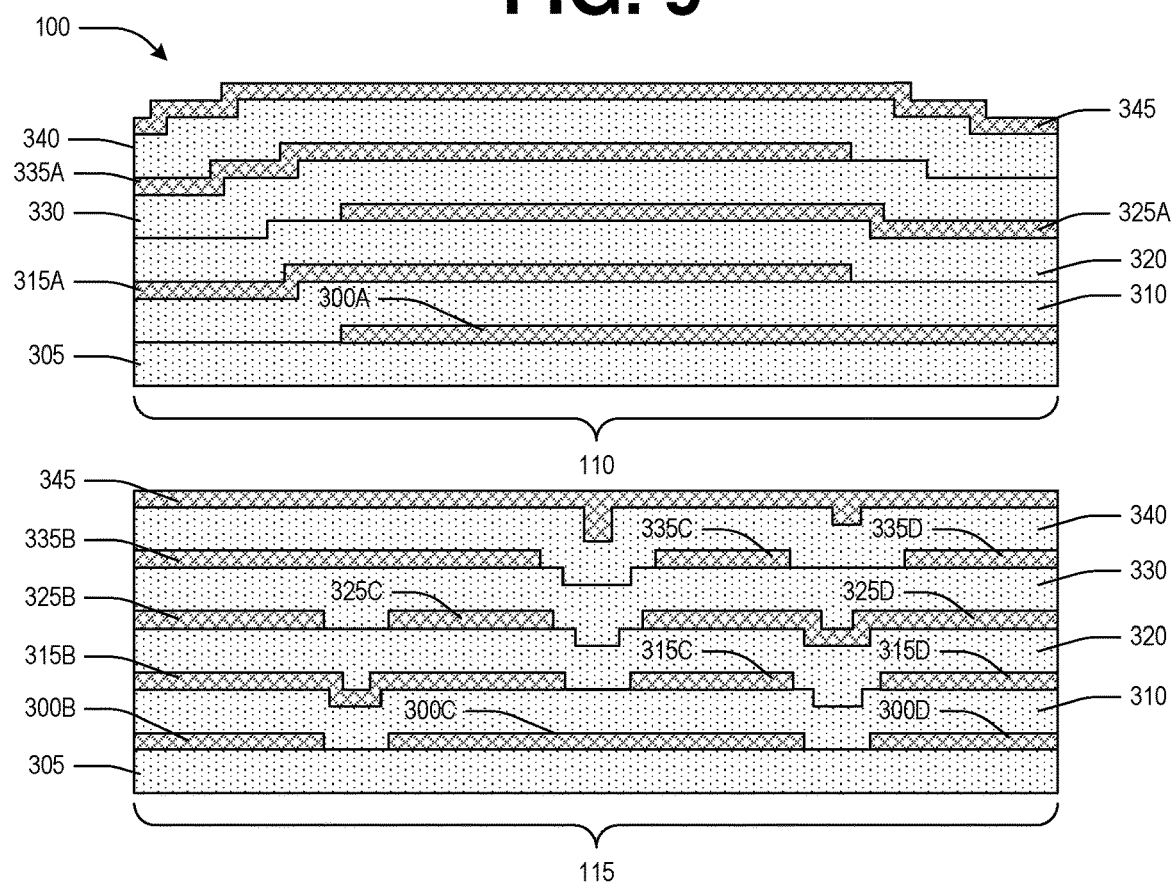

Referring to FIG. 10, a fifth dielectric layer 340 is formed over the fourth dielectric layer 330 and the conductive plates 335A, 335B, 335C, 335D and a fifth conductive layer 345 is formed over the fifth dielectric layer 340, according to some embodiments. In some embodiments, the fifth dielectric layer 340 comprises a dielectric material with a relatively high dielectric constant, such as hafnium dioxide, zirconium dioxide, lanthanum oxide, yttrium oxide, strontium oxide, tantalum oxide, barium oxide, and/or other suitable materials. The fifth dielectric layer 340 may be formed by thermal growth, chemical growth, ALD, CVD PECVD, and/or other suitable techniques. In some embodiments, a material composition of the fifth dielectric layer 340 is the same as a material composition of the first dielectric layer 305, the second dielectric layer 310, the third dielectric layer 320, and/or the fourth dielectric layer 330. In some embodiments, a material composition of the fifth dielectric layer 340 is not the same as a material composition of the first dielectric layer 305, the second dielectric layer 310, the third dielectric layer 320, and/or the fourth dielectric layer 330. In some embodiments, the fifth conductive layer 345 comprises a conductive material, such as Ti, TiN, Ta, TaN, TaC, W, Ir, Ru, Pt, aluminum, copper, and/or other suitable materials. In some embodiments, the fifth conductive layer 345 is formed by ALD, PVD, CVD, thermal evaporation, and/or other suitable techniques. In some embodiments, a material composition of the fifth conductive layer 345 is the same as a material composition of the first conductive layer 300, the second conductive layer 315, the third conductive layer 325, and/or the fourth conductive layer 335. In some embodiments, a material composition of the fifth conductive layer 345 is not the same as a material composition of the first conductive layer 300, the second conductive layer 315, the third conductive layer 325, and/or the fourth conductive layer 335.

Figure 11:
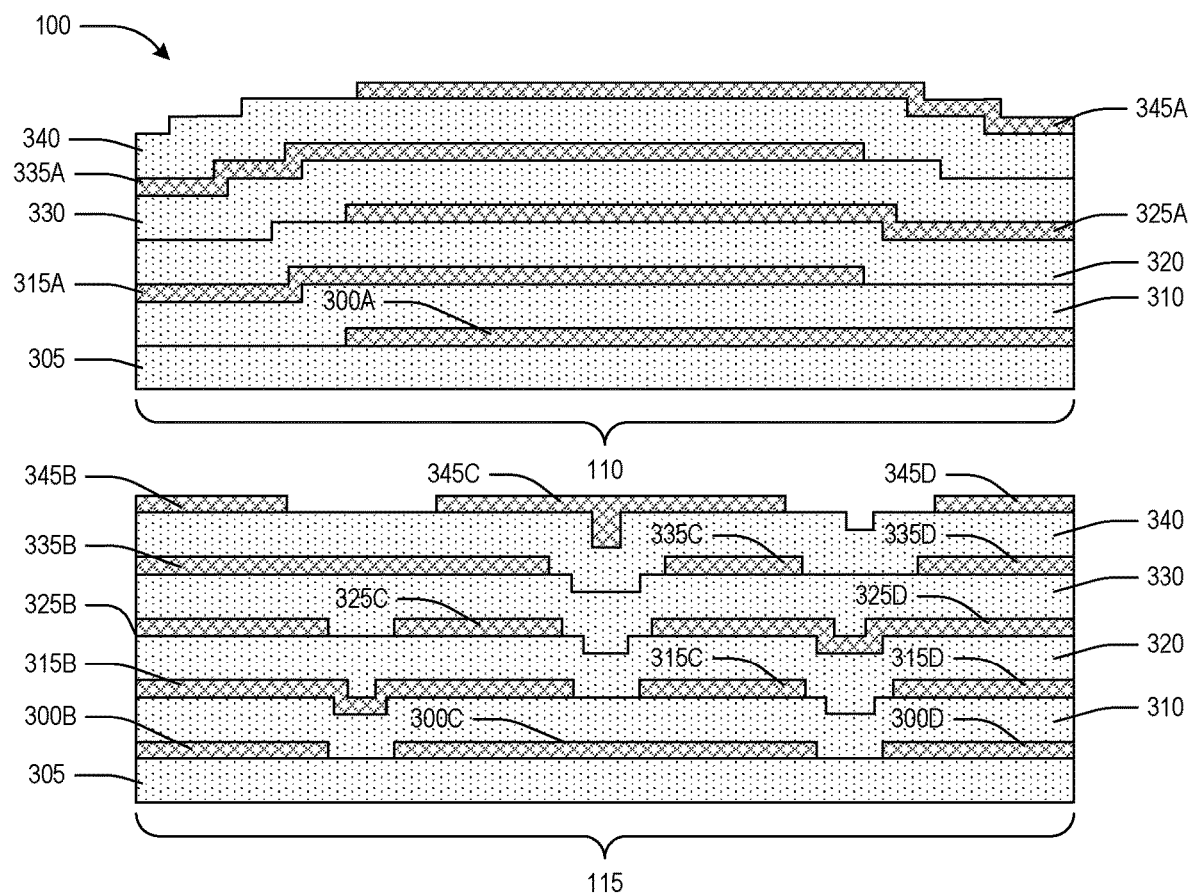

Referring to FIG. 11, the fifth conductive layer 345 is patterned to form conductive plates 345A, 345B, 345C, 345D, according to some embodiments. In some embodiments, the fifth conductive layer 345 is patterned by forming a mask over the fifth conductive layer 345, performing a photolithography patterning process for removing portions of the mask, and performing an etch process for removing portions of the fifth conductive layer 345 not covered by remaining portions of the mask to define the conductive plates 345A, 345B, 345C, 345D.

Figure 12:
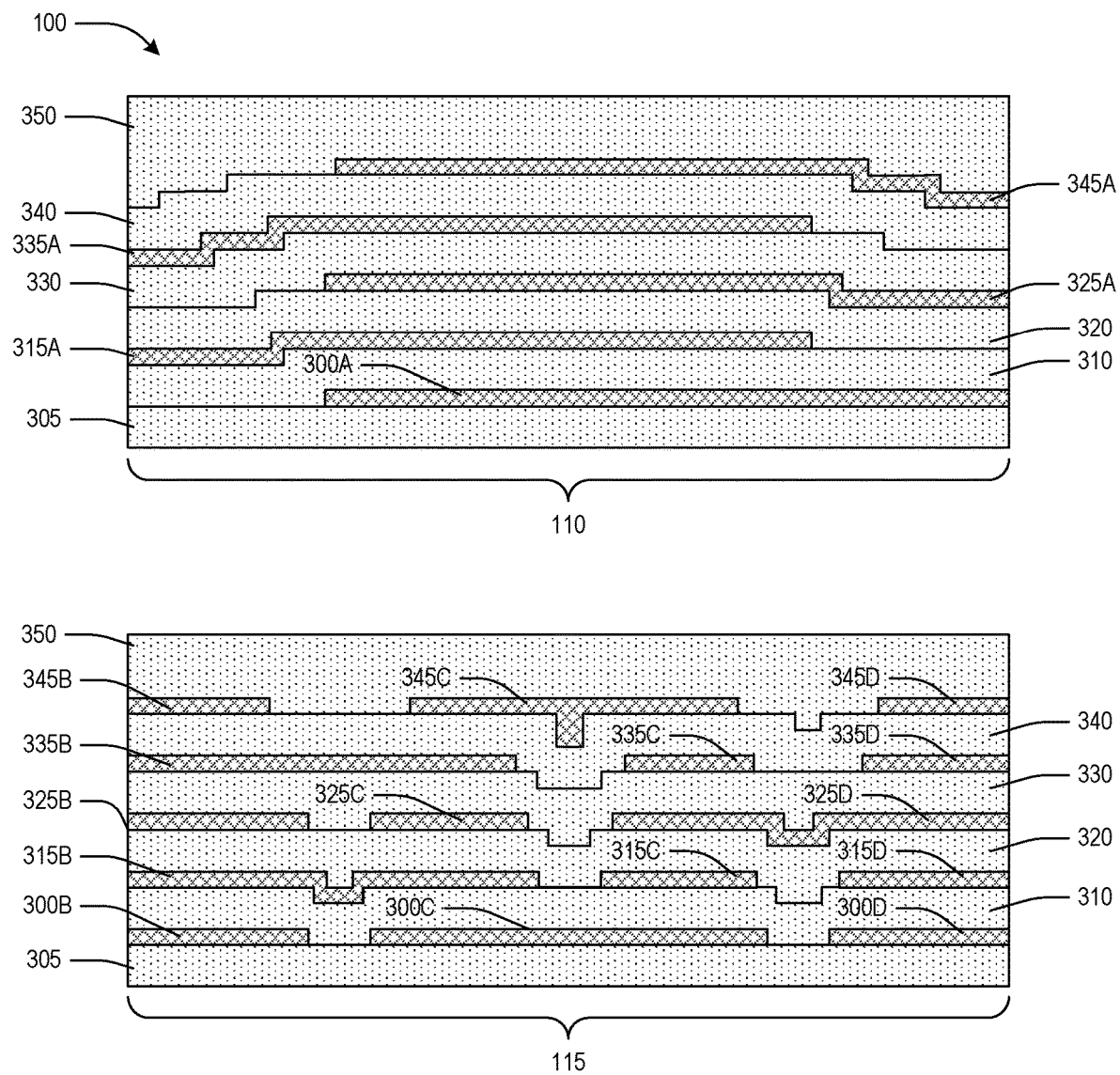

Referring to FIG. 12, a sixth dielectric layer 350 is formed over the fifth dielectric layer 340 and the conductive plates 345A, 345B, 345C, 345D, according to some embodiments. In some embodiments, a chemical mechanical polishing (CMP) process is performed to planarize the sixth dielectric layer 350. In some embodiments, the sixth dielectric layer 350 comprises a dielectric material with a relatively high dielectric constant, such as hafnium dioxide, zirconium dioxide, lanthanum oxide, yttrium oxide, strontium oxide, tantalum oxide, barium oxide, and/or other suitable materials. The sixth dielectric layer 350 may be formed by thermal growth, chemical growth, ALD, CVD PECVD, and/or other suitable techniques. In some embodiments, a material composition of the sixth dielectric layer 350 is the same as a material composition of the first dielectric layer 305, the second dielectric layer 310, the third dielectric layer 320, the fourth dielectric layer 330, and/or the fifth dielectric layer 340. In some embodiments, a material composition of the sixth dielectric layer 350 is not the same as a material composition of the first dielectric layer 305, the second dielectric layer 310, the third dielectric layer 320, the fourth dielectric layer 330, and/or the fifth dielectric layer 340.

Figure 13:
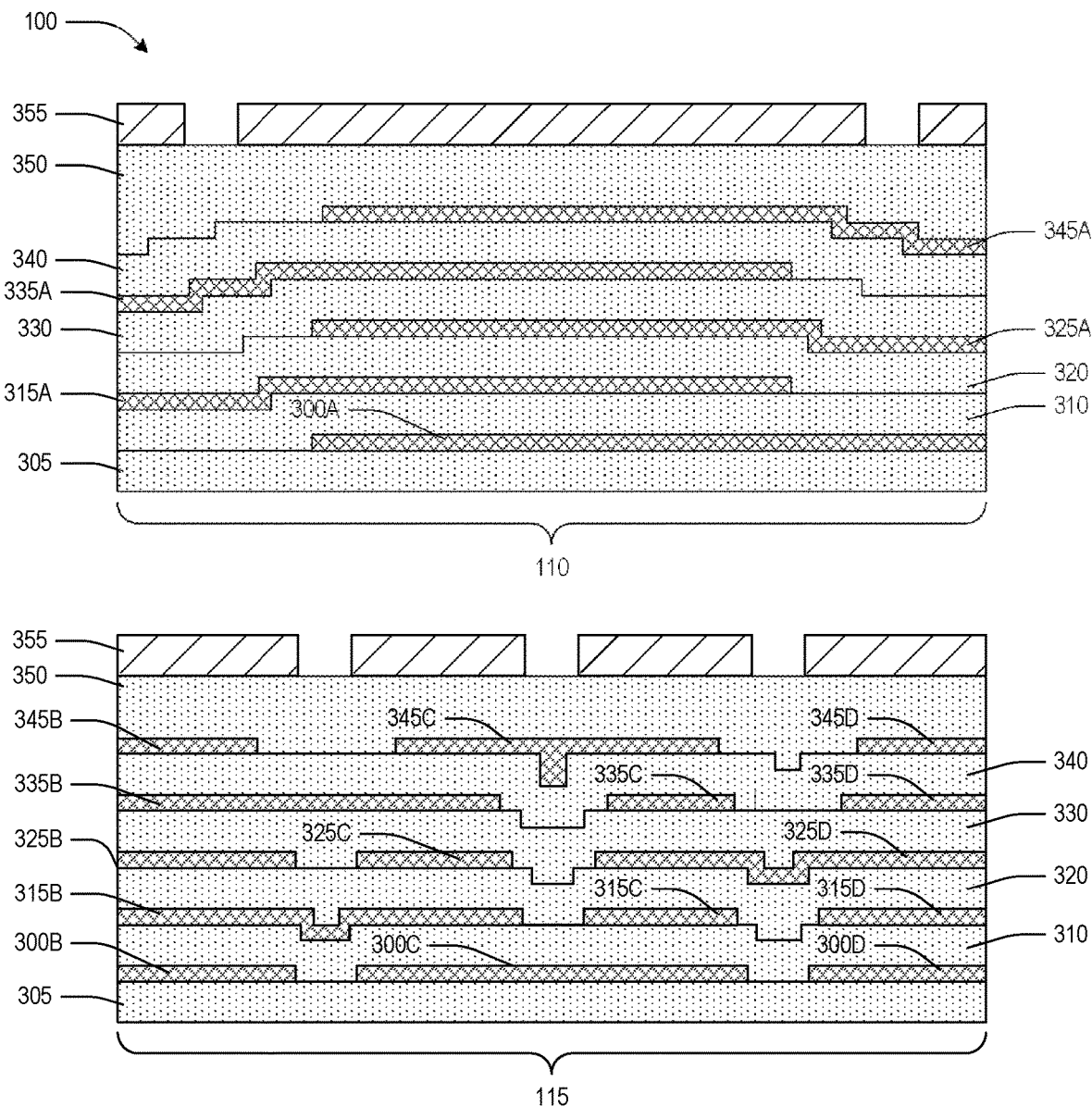

Referring to FIG. 13, a mask 355 is formed over the sixth dielectric layer 350, according to some embodiments. In some embodiments, the mask 355 is formed by forming a plurality of individually formed layers that together define a mask stack, such as a hard mask layer, a bottom antireflective coating (BARC) layer, an organic planarization layer (OPL), a photoresist layer, and/or other suitable layers. The hard mask layer is formed by at least one of PVD, sputtering, CVD, LPCVD, ALCVD, UHVCVD, RPCVD, ALD, MBE, LPE, spin on, growth, or other suitable techniques. In some embodiments, the hard mask layer comprises at least one of silicon, nitrogen, or other suitable materials. In some embodiments, the BARC layer is a polymer layer that is applied using a spin coating process. In some embodiments, the OPL comprises an organic polymer that is applied using a spin coating process. In some embodiments, the OPL comprises a dielectric layer. In some embodiments, the photoresist layer is formed by at least one of spinning, spray coating, or other suitable techniques, according to some embodiments. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist. One or more etchants have a selectivity such that the one or more etchants remove or etch away one or more layers exposed or not covered by the photoresist at a greater rate than the one or more etchants remove or etch away the photoresist. Accordingly, an opening in the photoresist allows the one or more etchants to form a corresponding opening in the one or more layers under the photoresist, and thereby transfer a pattern in the photoresist to the one or more layers under the photoresist. The photoresist is stripped or washed away after the pattern transfer.

In some embodiments, the hard mask layer is patterned to define the mask 355. The photoresist layer is exposed using a radiation source and a reticle to define a pattern in the photoresist layer and portions of the photoresist layer are removed to define a patterned photoresist layer. The underlying OPL, BARC layer, and/or hard mask layer are etched using the patterned photoresist layer as a template to form the mask 355 and expose portions of the sixth dielectric layer 350 under the mask 355.

Figure 14:
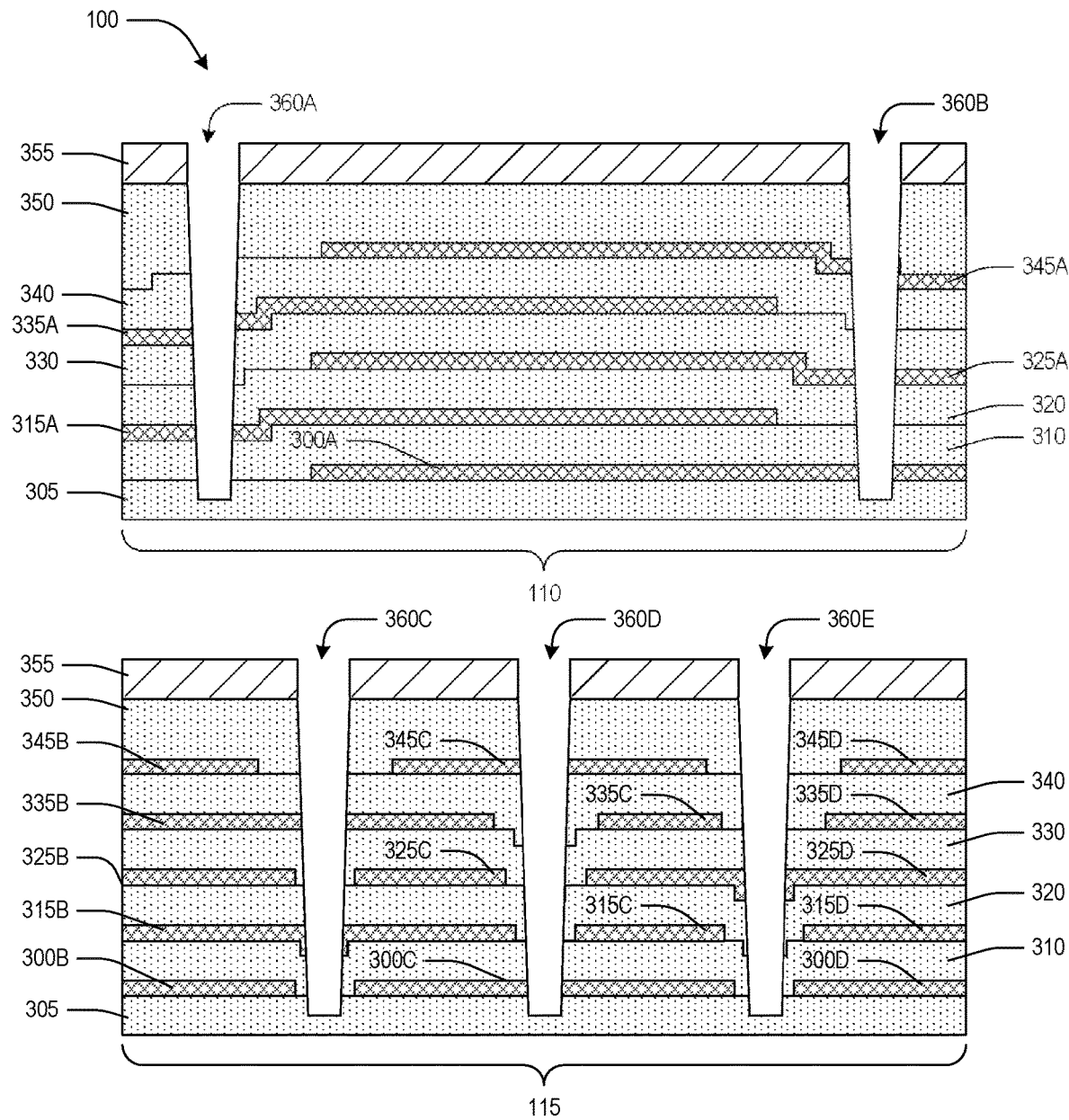

Referring to FIG. 14, via openings 360A, 360B, 360C, 360D, 360E are formed, according the some embodiments. In some embodiments, an etching processes is performed to pattern the dielectric layers 305, 310, 320, 330, 340, 350 and the conductive plates 300A, 315A, 315B, 325A, 325D, 335A, 335B, 345A, 345C using the mask 355 as an etch template to define to form the via openings 360A, 360B, 360C, 360D, 360E. The etching process comprises at least one of a plasma etching process, a reactive ion etching (RIE) process, or other suitable techniques. The etch process comprises an anisotropic etch process in accordance with some embodiments.

Figure 15:
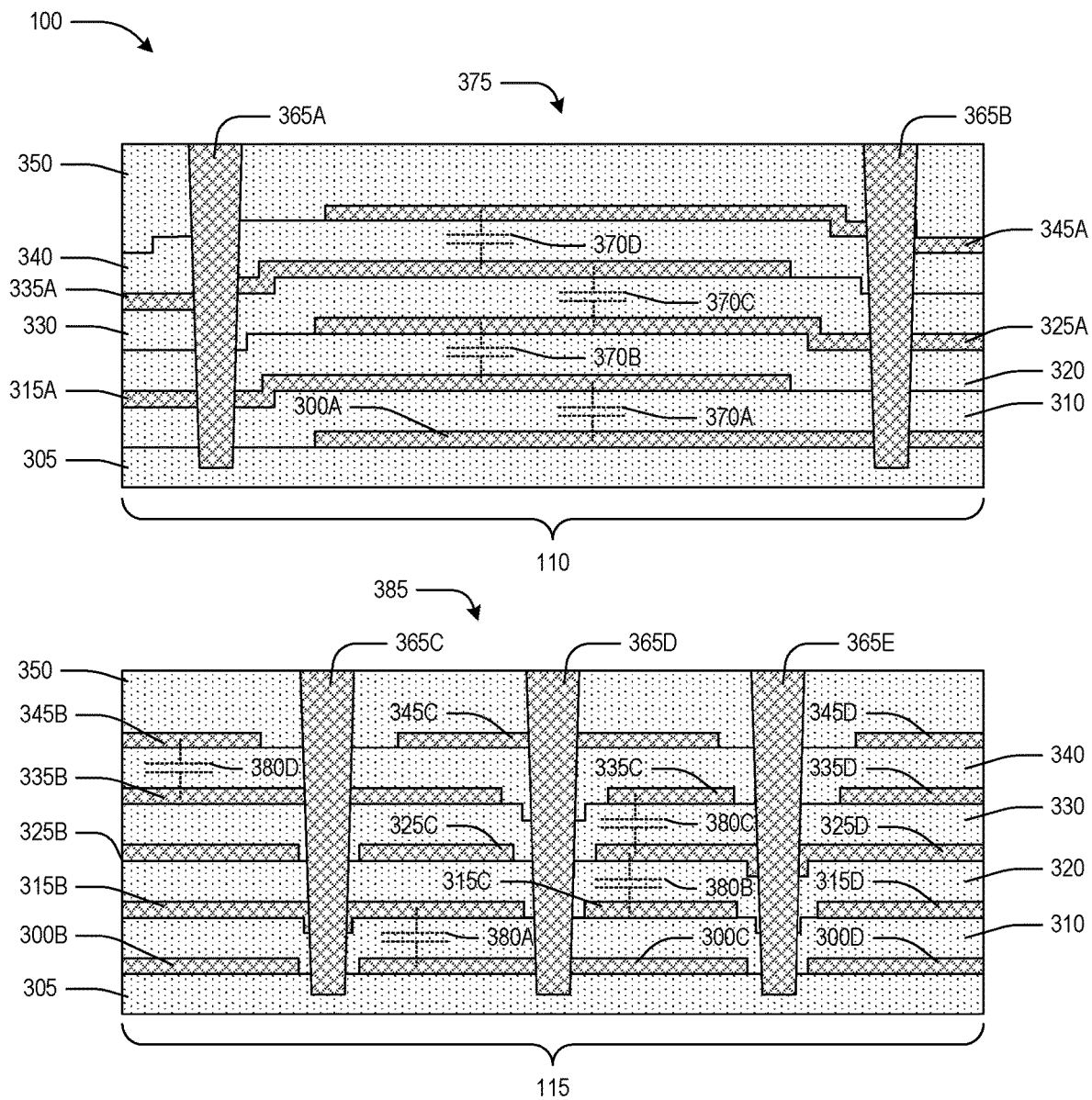

Referring to FIG. 15, conductive vias 365A, 365B, 365C, 365D, 365E are formed in the via openings 360A, 360B, 360C, 360D, 360E, in accordance with some embodiments. In some embodiments, the conductive vias 365A, 365B, 365C, 365D, 365E are formed by at least one of PVD, sputtering, CVD, LPCVD, ALCVD, UHVCVD, RPCVD, ALD, MBE, LPE, spin on, growth, or other suitable techniques. In some embodiments, at least one of the conductive vias 365A, 365B, 365C, 365D, 365E comprises at least one of tungsten, aluminum, copper, cobalt, or other suitable materials. In some embodiments, at least one of the conductive vias 365A, 365B, 365C, 365D, 365E comprises a plurality of layers, such as a barrier layer, a seed layer, a conductive fill layer, and/or other suitable layers. In some embodiments, a planarization process, such as chemical mechanical planarization (CMP), is performed to remove material of the conductive vias 365A, 365B, 365C, 365D, 365E extending outside the via openings 360A, 360B, 360C, 360D, 360E. In some embodiments, the planarization process removes the mask 355.

According to some embodiments, the conductive plates 300A, 315A and a portion of the dielectric layer 310 between the conductive plates 300A, 315A define a first capacitor 370A. The conductive plates 315A, 325A and a portion of the dielectric layer 320 between the conductive plates 315A, 325A define a second capacitor 370B. The conductive plates 325A, 355A and a portion of the dielectric layer 330 between the conductive plates 325A, 335A define a third capacitor 370C. The conductive plates 335A, 345A and a portion of the dielectric layer 330 between the conductive plates 335A, 345A define a fourth capacitor 370D. The capacitors 370A, 370B, 370C, 370D define a capacitor network 375. In some embodiments, the capacitors 370A, 370B, 370C, 370D are electrically coupled in a parallel arrangement such that the capacitance of the capacitor network 375 is the sum of the capacitance of each capacitor 370A, 370B, 370C, 370D. In some embodiments, the capacitor network 375 corresponds to the capacitor network 250 in FIG. 1.

According to some embodiments, the conductive plates 300B, 300C, 300D, 315B, 315C, 315D and a portion of the dielectric layer 310 between the conductive plates 300B, 300C, 300D, 315B, 315C, 315D define a first capacitor 380A. The conductive plates 315B, 315C, 315D, 325B, 325C, 325D and a portion of the dielectric layer 320 between the conductive plates 315B, 315C, 315D, 325B, 325C, 325D define a second capacitor 380B. The conductive plates 325B, 325C, 325D, 335B, 335C, 335D and a portion of the dielectric layer 330 between the conductive plates 325B, 325C, 325D, 335B, 335C, 335D define a third capacitor 380C. The conductive plates 335B, 335C, 335D, 345B, 345C, 345D and a portion of the dielectric layer 330 between the conductive plates 335B, 335C, 335D, 345B, 345C, 345D define a fourth capacitor 380D. The capacitors 380A, 380B, 380C, 380D define a capacitor network 385. In some embodiments, at least two of the capacitors 380A, 380B, 380C, 380D are electrically coupled in a series arrangement such that the capacitance of the capacitor network 385 is less than the capacitance of the capacitor network 375. In some embodiments, the capacitor network 385 corresponds to the capacitor network 255 in FIG. 1.

Figure 16:
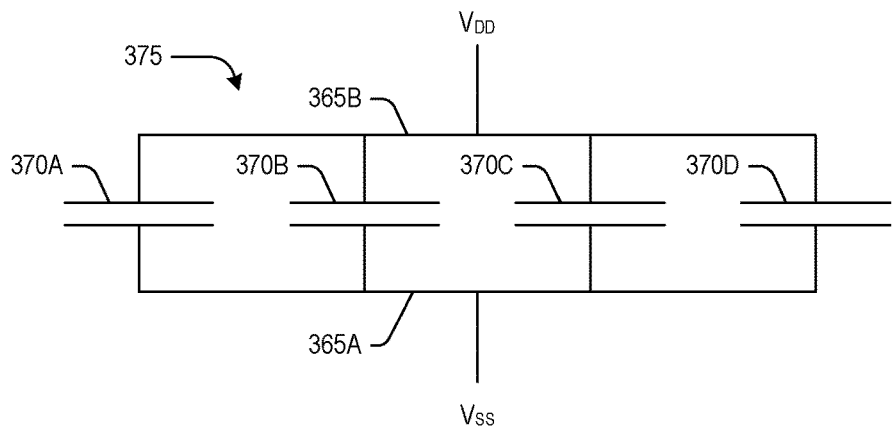
FIGS. 16-18 are circuit diagrams of capacitor networks, in accordance with some embodiments.
Figure 17:
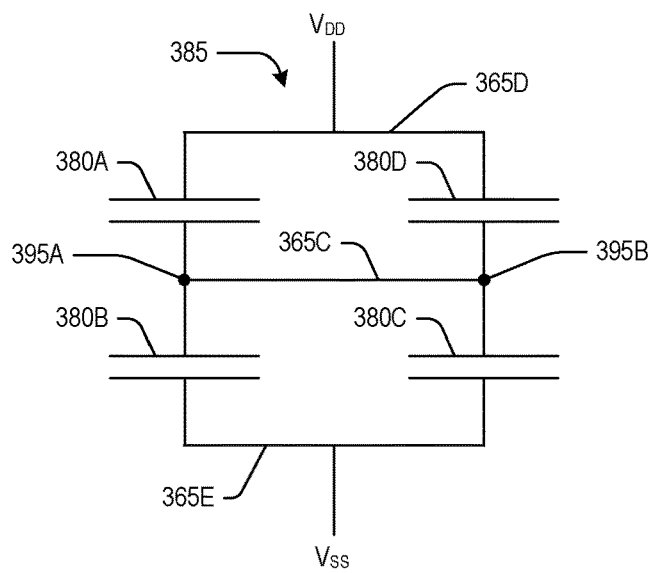

Referring to FIGS. 16 and 17, circuit diagrams 400A, 400B of the capacitor networks 375, 385 are illustrated, respectively, according to some embodiments. According to some embodiments, a positive supply voltage, such as $V_{DD}$, is applied to the conductive vias 365B, 365D, and a negative supply voltage, such as $V_{SS}$, is applied to the conductive vias 365A, 365E. The conductive via 365C serves as an internal connector. As illustrated in FIG. 16, the capacitors 370A, 370B, 370C, 370D are connected in parallel, according to some embodiments. As illustrated in FIG. 17, the capacitors 380A, 380B are connected in series, and the capacitors 380C, 380D are connected in series. The two groups of series capacitors (380A, 380B vs. 380C, 380D) are connected in parallel. The conductive via 365C connects an intermediate node 395A defined between the capacitors 380A, 380B to an intermediate node 395B defined between the capacitors 380C, 380D.

The conductive via 365B is connected to the conductive power supply line 210 or the conductive contact pad 225, and the conductive via 365D is connected to the conductive power supply line 215 or the conductive contact pad 230. In some embodiments, the conductive via 365A is connected to another conductive power supply line or conductive contact (not shown) in the first region 110, and/or the conductive via 365E is connected to another conductive power supply line or conductive contact (not shown) in the second region 115.

Figure 18:
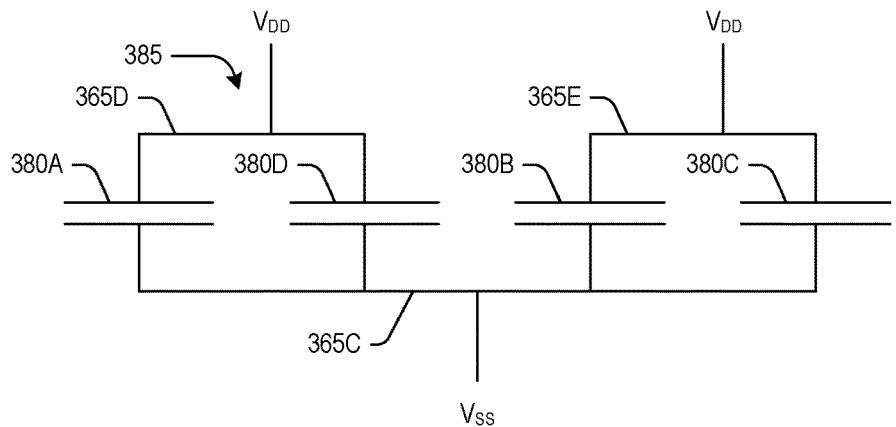

Referring to FIG. 18, the capacitors 380A, 380B, 380C, 380D in the capacitor network 385 may also be connected in parallel, according to some embodiments. The capacitors 380A, 380B, 380C, 380D are connected in parallel by applying the positive supply voltage, such as $V_{DD}$, to the conductive vias 365D, 365E, and applying the negative supply voltage, such as $V_{SS}$, to the conductive via 365C.

In the capacitor network 375, where the capacitors 370A, 370B, 370C, 370D are connected in parallel, the capacitance is increased for situations where the supply voltage is less than a breakdown voltage of the material of the dielectric layers 305, 310, 320, 330, 340, 350. This situation allows the dielectric material to be selected to increase performance of the devices 120 in the first region 110. Providing the series arrangement of the capacitors 380A, 380B, 380C, 380D in the capacitor network 385 allows the same dielectric material to be used in a situation where the supply voltage of the second region is greater than a breakdown voltage of the dielectric material if the supply voltage were to be applied across a single capacitor.

The capacitor network 385 provides flexibility in that the capacitors 380A, 380B, 380C, 380D could be connected in the parallel arrangement shown in FIG. 18 for a low voltage domain, and the capacitors 380A, 380B, 380C, 380D could be connected in the series arrangement shown in FIG. 17 for a high voltage domain. However, the total capacitance of the capacitor network 385 connected in parallel would less than the total capacitance of the capacitor network 375 due to the reduced conductive plate area in the capacitor network 375 as compared to the conductive plate area in the capacitor network 385.

Figure 19:
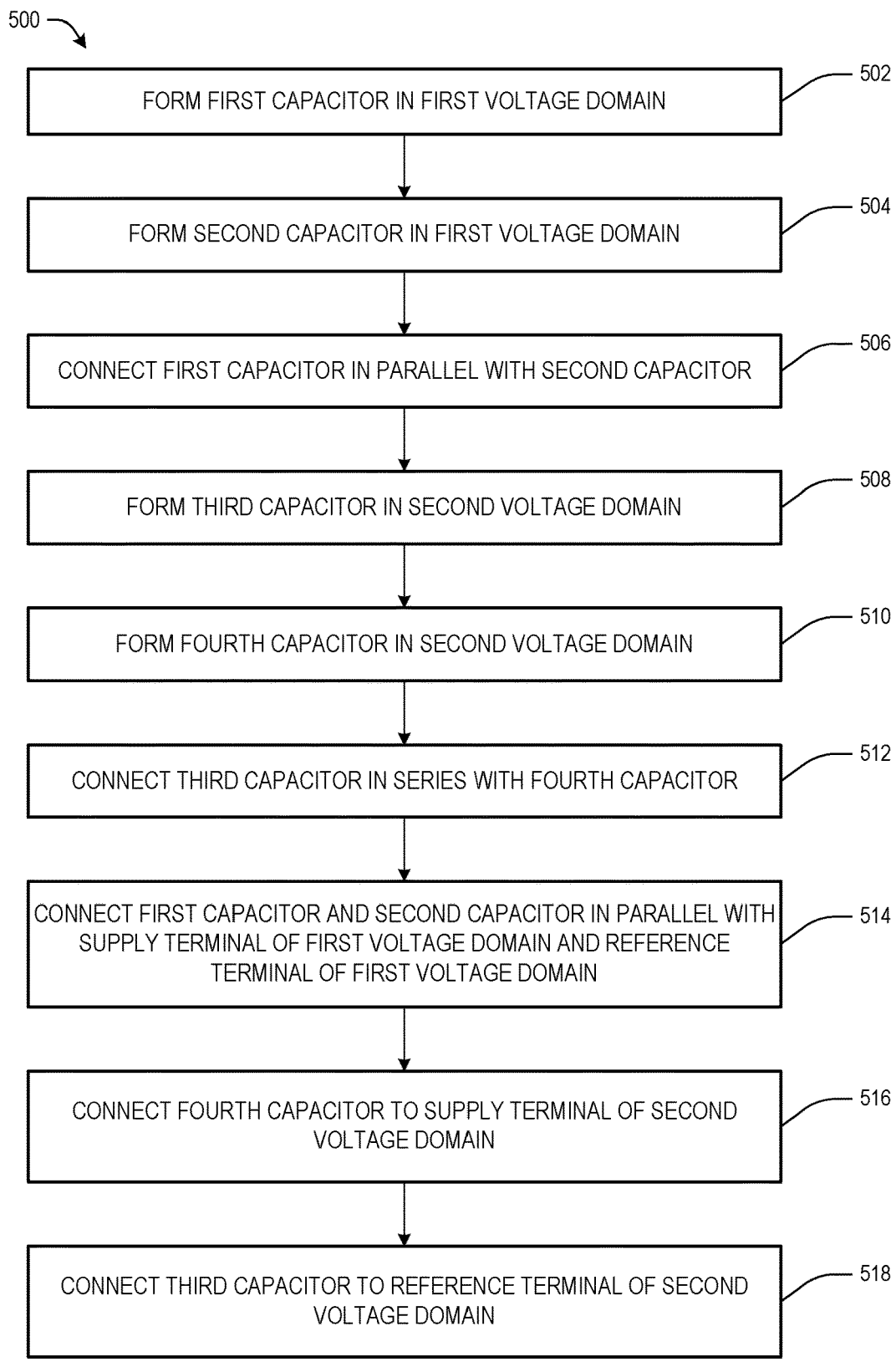
FIG. 19 is a flow chart illustrating a method of handling a semiconductor substrate, in accordance with some embodiments.

FIG. 19 is a flow diagram illustrating a method 500 for forming a semiconductor arrangement, in accordance with some embodiments. At 502, a first capacitor is formed in a first voltage domain. At 504, a second capacitor is formed in the first voltage domain. At 506, the first capacitor is connected in parallel with the second capacitor. At 508, a third capacitor is formed in a second voltage domain. At 510, a fourth capacitor is formed in the second voltage domain. At 512, the third capacitor is connected in series with the fourth capacitor. At 514, the first capacitor and the second capacitor are connected in parallel with a supply terminal of the first voltage domain and a reference terminal of the first voltage domain. At 516, the fourth capacitor is connected to a supply terminal of the second voltage domain. At 518, the third capacitor is connected to a reference terminal of the second voltage domain.

Figure 20:
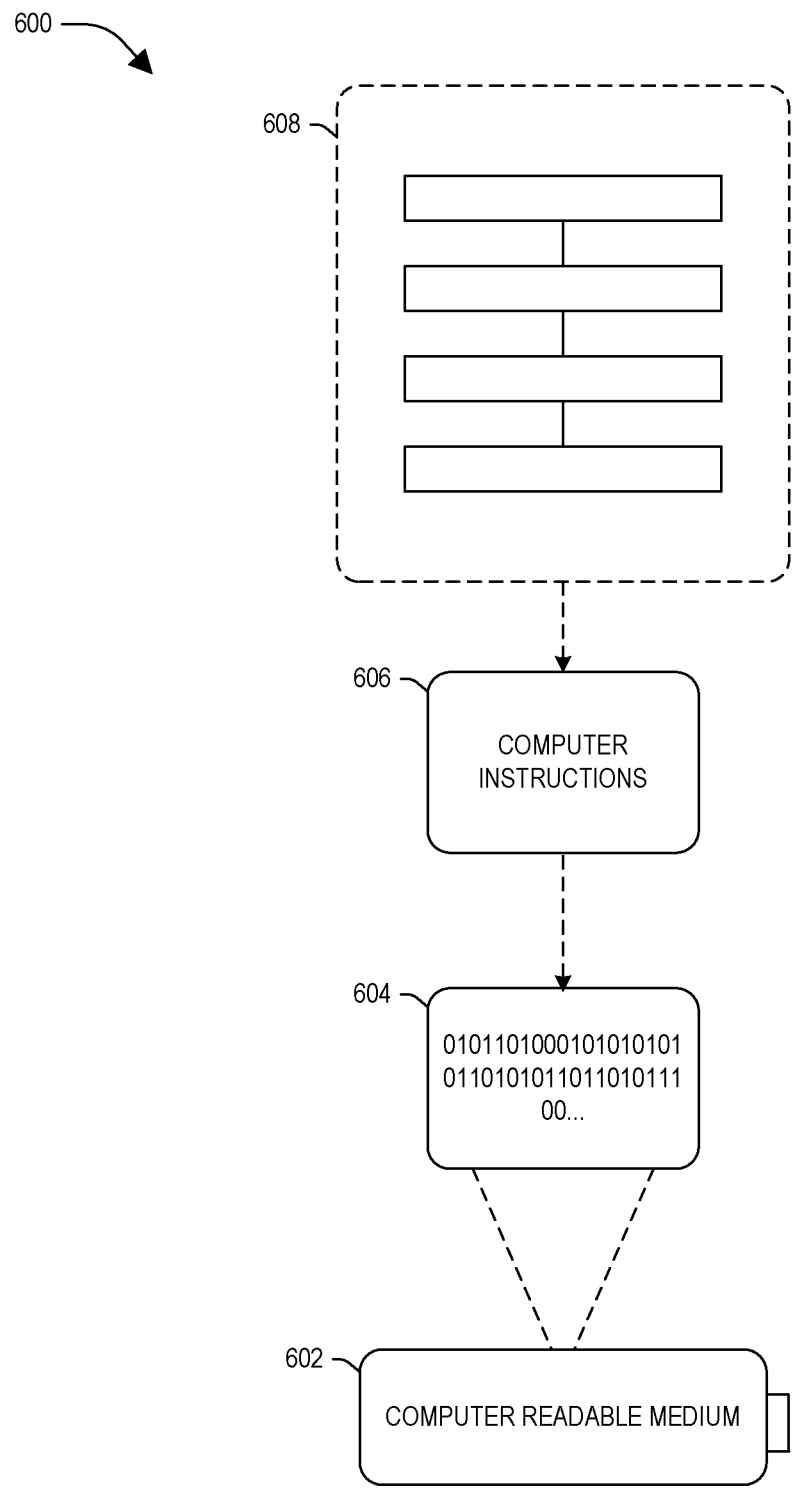
FIG. 20 illustrates an example computer-readable medium wherein processor-executable instructions configured to embody one or more of the provisions set forth herein may be comprised, in accordance with some embodiments.

Still another embodiment involves a computer-readable medium comprising processor-executable instructions configured to implement one or more of the techniques presented herein. An exemplary computer-readable medium is illustrated in FIG. 20, wherein the embodiment 600 comprises a computer-readable medium 602 (e.g., a CD-R, DVD-R, flash drive, a platter of a hard disk drive, etc.), on which is encoded computer-readable data 604. This computer-readable data 604 in turn comprises a set of processor-executable computer instructions 606 configured to operate according to one or more of the principles set forth herein. In some embodiments 600, the processor-executable computer instructions 606 are configured to perform a method 608, such as at least some of the aforementioned described methods. In some embodiments, the processor-executable computer instructions 606 are configured to implement a system, such as at least some of the aforementioned systems.

Many such computer-readable media may be devised by those of ordinary skill in the art that are configured to operate in accordance with the techniques presented herein.

Figure 21:
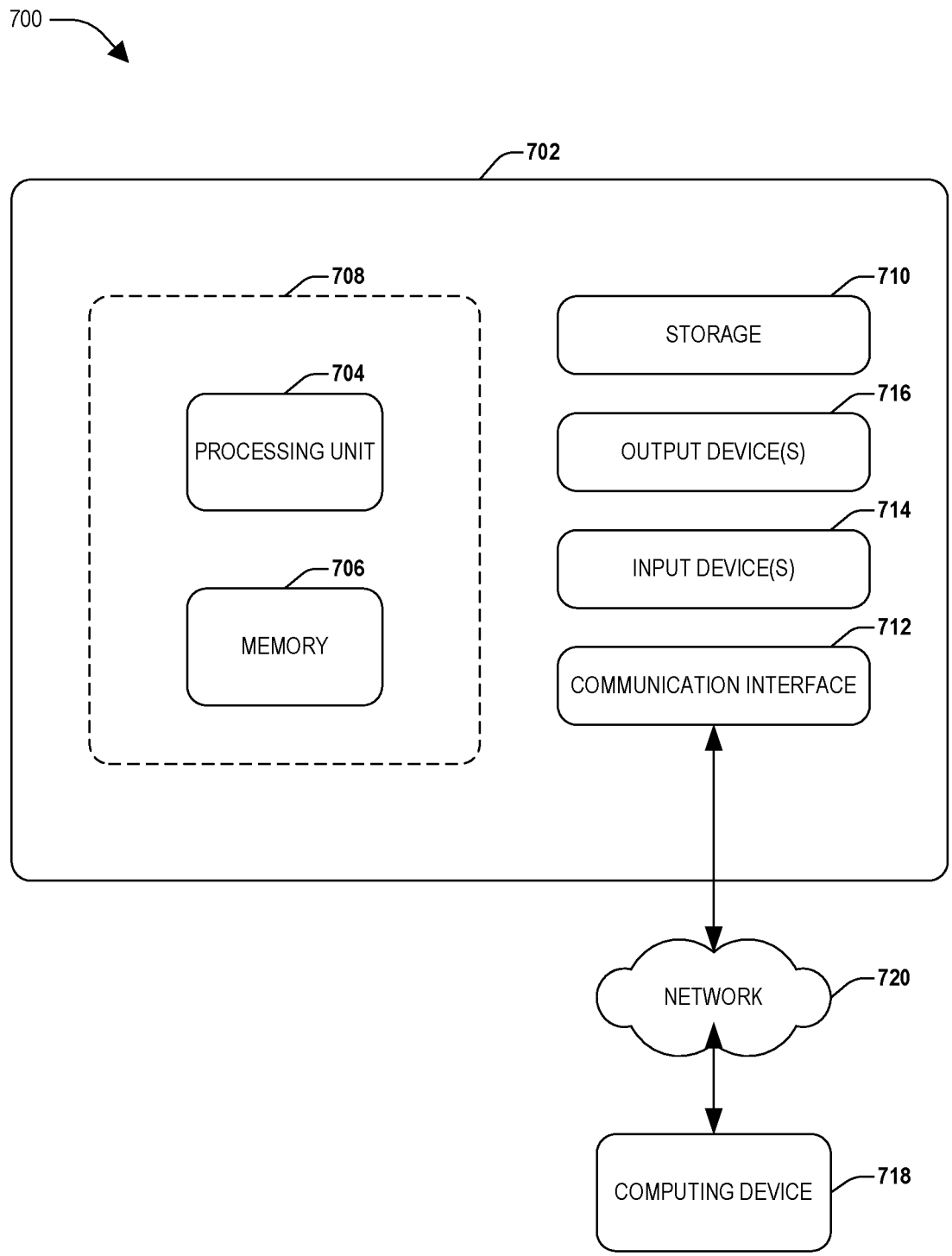
FIG. 21 illustrates an example computing environment wherein one or more of the provisions set forth herein may be implemented, in accordance with some embodiments.

FIG. 21 and the following discussion provide a brief, general description of a suitable computing environment to implement embodiments of one or more of the provisions set forth herein. The operating environment of FIG. 21 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 21 depicts an example of a system 700 comprising a computing device 702 to implement some embodiments provided herein. In some configurations, computing device 702 includes at least one processing unit 704 and memory 706. Depending on the exact configuration and type of computing device, the memory 706 may be volatile (such as RAM, for example), non-volatile (such as ROM, flash memory, etc., for example), or some combination of the two. This configuration is illustrated in FIG. 21 by dashed line 708.

In some embodiments, the computing device 702 may include additional features and/or functionality. For the example, the computing device 702 may also include additional storage (e.g., removable and/or non-removable) including, but not limited to, magnetic storage, optical storage, and the like. Such additional storage is illustrated in FIG. 21 by storage 710. In some embodiments, computer readable instructions to implement one or more embodiments provided herein may be in the storage 710. The storage 710 may also store other computer readable instructions to implement an operating system, an application program, and the like. Computer readable instructions may be loaded in the memory 706 for execution by processing unit 704, for example.

The term "computer readable media" as used herein includes computer storage media. Computer storage media includes volatile and nonvolatile, removable and non-removable media implemented in any method or technology for storage of information such as computer readable instructions or other data. The memory 706 and storage 710 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by the computing device 702. Any such computer storage media may be part of the computing device 702.

In some embodiments, the computing device 702 comprises a communication interface 712, or a multiple communication interfaces, that allow the computing device 702 to communicate with other devices. The communication interface 712 may include, but is not limited to, a modem, a Network Interface Card (NIC), an integrated network interface, a radio frequency transmitter/receiver, an infrared port, a Universal Serial Bus (USB) connection, or other interface for connecting the computing device 702 to other computing devices. The communication interface 712 may implement a wired connection or a wireless connection. The communication interface 712 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

The computing device 702 may include input device(s) 714 such as keyboard, mouse, pen, voice input device, touch input device, infrared cameras, video input devices, and/or any other suitable input device. An output device(s) 716 such as one or more displays, speakers, printers, and/or any other suitable output device may also be included in the computing device 702. The input device 714 and the output device 716 may be connected to the computing device 702 via a wired connection, wireless connection, or any combination thereof. In some embodiments, an input device or an output device from another computing device may be used as the input device(s) 714 or the output device(s) 716 for the computing device 702.

Components of the computing device 722 may be connected by various interconnects, such as a bus. Such interconnects may include a Peripheral Component Interconnect (PCI), such as PCI Express, a USB, firewire (IEEE 1394), an optical bus structure, and the like. In some embodiments, components of the computing device 702 may be interconnected by a network. For example, the memory 706 may be comprised of multiple physical memory units located in different physical locations interconnected by a network.

Those skilled in the art will realize that storage devices utilized to store computer readable instructions may be distributed across a network. For example, a computing device 718 accessible via a network 720 may store computer readable instructions to implement one or more embodiments provided herein. The computing device 702 may access the computing device 718 and download a part or all of the computer readable instructions for execution. Alternatively, the computing device 702 may download pieces of the computer readable instructions, as needed, or some instructions may be executed at the computing device 702 and some instructions may be executed at the computing device 718.

According to some embodiments, a method of forming a semiconductor arrangement includes forming a first capacitor in a first voltage domain and forming a second capacitor in the first voltage domain. The first capacitor is connected in parallel with the second capacitor. A third capacitor and a fourth capacitor are formed in a second voltage domain. The third capacitor is connected in series with the fourth capacitor. The first capacitor and the second capacitor are connected in parallel with a supply terminal of the first voltage domain and a reference terminal of the first voltage domain. The fourth capacitor is connected to a supply terminal of the second voltage domain. The third capacitor is connected to a reference terminal of the second voltage domain.

According to some embodiments, a semiconductor arrangement includes a first conductive plate, a first portion of a dielectric material over the first conductive plate, a second conductive plate over the first portion of the dielectric material, a second portion of the dielectric material over the second conductive plate, a third conductive plate over the second portion of the dielectric material, a third portion of the dielectric material over the third conductive plate, a fourth conductive plate over the third portion of the dielectric material, a fourth portion of the dielectric material over the fourth conductive plate, and a fifth conductive plate over the fourth portion of the dielectric material. A first conductive via is connected to the first conductive plate and the fifth conductive plate. A second conductive via is connected to the third conductive plate. A third conductive via is connected to the second conductive plate and the fourth conductive plate.

According to some embodiments, a semiconductor arrangement includes a first voltage domain including a first voltage plane associated with a first supply voltage and including a first supply terminal and a first reference terminal. A first capacitor network is connected across the first supply terminal and the first reference terminal and includes a first stack comprising alternating layers of a conductive material having a first thickness and a dielectric material having a second thickness. The first supply voltage is less than a breakdown voltage of the dielectric material having the second thickness. A second voltage domain includes a second voltage plane associated with a second supply voltage and including a second supply terminal and a second reference terminal. A second capacitor network is connected across the second supply terminal and the second reference terminal and includes a second stack comprising alternating layers of the conductive material having the first thickness and the dielectric material having the second thickness. The second supply voltage is greater than the breakdown voltage of the dielectric material having the second thickness.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc., depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context is directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a first conductive plate;
   a first portion of a dielectric material over the first conductive plate;
   a second conductive plate over the first portion of the dielectric material;
   a second portion of the dielectric material over the second conductive plate;
   a third conductive plate over the second portion of the dielectric material;

a third portion of the dielectric material over the third conductive plate;

a fourth conductive plate over the third portion of the dielectric material;

a fourth portion of the dielectric material over the fourth conductive plate;

a fifth conductive plate over the fourth portion of the dielectric material;

a first conductive via directly physically contacting the first conductive plate and the fifth conductive plate;

a second conductive via directly physically contacting the third conductive plate; and a third conductive via directly physically contacting the second conductive plate and the fourth conductive plate.

2. The semiconductor arrangement of claim 1, comprising:

a supply terminal; and a reference terminal, wherein:

the first conductive via is connected to the supply terminal, and the second conductive via is connected to the reference terminal.

3. The semiconductor arrangement of claim 2, comprising:

a voltage source, wherein:

the supply terminal is connected to the voltage source to receive a supply voltage from the voltage source, and the supply voltage is greater than a breakdown voltage of the dielectric material.

4. The semiconductor arrangement of claim 1, comprising:

a supply terminal; and a reference terminal, wherein:

the first conductive via is connected to the supply terminal, the second conductive via is connected to the supply terminal, and the third conductive via is connected to the reference terminal.

5. The semiconductor arrangement of claim 4, wherein:

the supply terminal is connected to a voltage source to receive a supply voltage from the voltage source, and the supply voltage is less than a breakdown voltage of the dielectric material.

6. The semiconductor arrangement of claim 1, wherein:

the dielectric material comprises a high-k dielectric material.

7. A semiconductor arrangement, comprising:

a first voltage domain connected to at least one of a core region or a logic region configured to operate at a first supply voltage, the first voltage domain comprising:

a first supply terminal for receiving the first supply voltage from a first voltage source;

a first reference terminal; and a first capacitor network connected across the first supply terminal and the first reference terminal and comprising a stack of alternating layers of a conductive material having a first thickness and a dielectric material having a second thickness, wherein the first supply voltage is less than a breakdown voltage of the dielectric material having the second thickness; and a second voltage domain connected to an input/output region configured to operate at a second supply voltage different than the first supply voltage, the second voltage domain comprising:

a second supply terminal for receiving the second supply voltage from a second voltage source;

a second reference terminal; and a second capacitor network connected across the second supply terminal and the second reference terminal and comprising the stack of alternating layers of the conductive material having the first thickness and the dielectric material having the second thickness, wherein the second supply voltage is greater than the breakdown voltage of the dielectric material having the second thickness.

8. The semiconductor arrangement of claim 7, wherein:

the first capacitor network defines a first capacitor and a second capacitor connected in parallel across the first supply terminal and the first reference terminal.

9. The semiconductor arrangement of claim 7, wherein:

the stack of alternating layers comprises a first conductive layer, a second conductive layer over the first conductive layer and defining a first capacitor, a third conductive layer over the second conductive layer and defining a second capacitor, a fourth conductive layer over the third conductive layer and defining a third capacitor, and a fifth conductive layer over the fourth conductive layer and defining a fourth capacitor, and the first capacitor, the second capacitor, the third capacitor, and the fourth capacitor are connected in parallel across the first supply terminal and the first reference terminal.

10. The semiconductor arrangement of claim 9, wherein:

the first capacitor network comprises:

a first conductive via coupled to the first conductive layer, the third conductive layer, the fifth conductive layer, and the first supply terminal; and a second conductive via coupled to the second conductive layer, the fourth conductive layer, and the first reference terminal.

11. The semiconductor arrangement of claim 9, wherein:

the first capacitor network comprises:

a first conductive via coupled to the first conductive layer, the fifth conductive layer, and the first supply terminal;

a second conductive via coupled to the second conductive layer, the fourth conductive layer, and the first reference terminal; and a third conductive via coupled to the third conductive layer and the first supply terminal.

12. The semiconductor arrangement of claim 7, wherein:

the stack of alternating layers comprises a first conductive layer, a second conductive layer over the first conductive layer and defining a first capacitor, a third conductive layer over the second conductive layer and defining a second capacitor, a fourth conductive layer over the third conductive layer and defining a third capacitor, and a fifth conductive layer over the fourth conductive layer and defining a fourth capacitor, the first capacitor and the second capacitor are connected in series, and the third capacitor and the fourth capacitor are connected in series.

13. The semiconductor arrangement of claim 12, wherein:
a first intermediate node defined between the first capacitor and the second capacitor is connected to a second intermediate node defined between the third capacitor and the fourth capacitor.

14. The semiconductor arrangement of claim 12, wherein:
the first capacitor network comprises:
- a first conductive via coupled to the first conductive layer, the fifth conductive layer, and the second supply terminal;
- a second conductive via coupled to the second conductive layer and the fourth conductive layer; and
- a third conductive via coupled to the third conductive layer and the second reference terminal.

15. A semiconductor arrangement, comprising:
a first voltage domain connected to at least one of a core region or a logic region configured to operate at a first supply voltage, the first voltage domain comprising:
- a first capacitor;
- a second capacitor connected in parallel with the first capacitor;
- a first supply terminal for receiving the first supply voltage from a first voltage source;
- a first reference terminal, wherein the first capacitor and the second capacitor are connected in parallel with the first supply terminal and the first reference terminal;

a second voltage domain connected to an input/output region configured to operate at a second supply voltage different than the first supply voltage, the second voltage domain comprising:
- a third capacitor;
- a fourth capacitor connected in series with the third capacitor;
- a second supply terminal for receiving the second supply voltage; and
- a second reference terminal connected to the third capacitor.

16. The semiconductor arrangement of claim 15, wherein:
at least one of the first capacitor, the second capacitor, the third capacitor, or the fourth capacitor comprise a dielectric material.

17. The semiconductor arrangement of claim 16, wherein the dielectric material comprises a high-k dielectric material.

18. The semiconductor arrangement of claim 16, wherein:
the first supply voltage is less than a breakdown voltage of the dielectric material, and
the second supply voltage is greater than the breakdown voltage of the dielectric material.

19. The semiconductor arrangement of claim 18, wherein:
the first capacitor comprises:
- a first conductive plate;
- a first portion of the dielectric material over the first conductive plate; and
- a second conductive plate over the first portion of the dielectric material and the first conductive plate, the second capacitor comprises:
- a second portion of the dielectric material over the second conductive plate; and
- a third conductive plate over the second portion of the dielectric material and the second conductive plate, and the semiconductor arrangement comprises:
- a first conductive via connecting the first conductive plate to the third conductive plate and connected to the first supply terminal; and
- a second conductive via connected to the second conductive plate and the first reference terminal.

20. The semiconductor arrangement of claim 18, wherein:
the third capacitor comprises:
- a first conductive plate;
- a first portion of the dielectric material over the first conductive plate; and
- a second conductive plate over the first portion of the dielectric material and the first conductive plate, the fourth capacitor comprises:
- a second portion of the dielectric material over the second conductive plate; and
- a third conductive plate over the second portion of the dielectric material and the second conductive plate, and the semiconductor arrangement comprises:
- a first conductive via connected to the third conductive plate and connected to the second supply terminal; and
- a second conductive via connected to the first conductive plate and the second reference terminal.

* * * * *